United States Patent [19]
Engel et al.

[11] Patent Number: 5,861,683
[45] Date of Patent: Jan. 19, 1999

[54] PANELBOARD FOR CONTROLLING AND MONITORING POWER OR ENERGY

[75] Inventors: Joseph C. Engel, Monroeville; Mark F. Rusnak, North Huntingdon Township; John C. Schlotterer, Franklin Township, all of Pa.

[73] Assignee: Eaton Corporation, Cleveland, Ohio

[21] Appl. No.: 865,687

[22] Filed: May 30, 1997

[51] Int. Cl.$^6$ .................................................. H02B 1/01
[52] U.S. Cl. ........................ 307/38; 307/147; 361/601; 361/622; 361/627
[58] Field of Search .......................... 307/38, 147, 148; 361/601, 627, 659, 622; 364/492, 528.21

[56] References Cited

U.S. PATENT DOCUMENTS

| | | | |
|---|---|---|---|
| 3,955,138 | 5/1976 | Milkovic | 324/107 |
| 4,027,241 | 5/1977 | Jauch | 324/142 |
| 4,451,784 | 5/1984 | Milkovic | 324/142 |
| 4,553,115 | 11/1985 | Grunert et al. | 335/14 |
| 4,591,810 | 5/1986 | Mackenzie et al. | 332/9 R |
| 4,642,726 | 2/1987 | Matsko et al. | 361/198 |
| 4,654,614 | 3/1987 | Chien et al. | 335/201 |
| 4,887,057 | 12/1989 | Gula et al. | 335/190 |
| 4,918,566 | 4/1990 | Brodsky et al. | 361/166 |
| 5,148,278 | 9/1992 | Jordan et al. | 348/609 |
| 5,200,724 | 4/1993 | Gula et al. | 335/166 |
| 5,231,565 | 7/1993 | Bilas et al. | 364/528.21 |
| 5,233,511 | 8/1993 | Bilas et al. | 361/622 |
| 5,315,531 | 5/1994 | Oravetz et al. | 364/550 |
| 5,341,191 | 8/1994 | Crookston et al. | 335/16 |
| 5,394,296 | 2/1995 | Erickson, Jr. et al. | 361/659 |
| 5,455,760 | 10/1995 | Bilas et al. | 364/528.21 |
| 5,524,083 | 6/1996 | Horne et al. | 364/492 |
| 5,572,468 | 11/1996 | Ishinabe et al. | 365/189.05 |
| 5,705,862 | 1/1998 | Lutz et al. | 307/147 |

*Primary Examiner*—Albert W. Paladini
*Attorney, Agent, or Firm*—Martin J. Moran

[57] ABSTRACT

A panelboard for power lines and loads includes a housing; a plurality of circuit breakers housed by the housing; and a panelboard controller substantially housed by the housing. Some of the circuit breakers, which switch a circuit from one or more of the power lines to the loads, include remotely controllable actuating circuits for actuating the circuit breakers and switching a circuit from one or more of the power lines to one or more of the loads. The panelboard controller includes a monitoring circuit for monitoring power or energy consumed in the circuits of the circuit breakers and a control circuit for controlling the remotely controllable actuating circuits.

27 Claims, 16 Drawing Sheets

PANELBOARD FOR CONTROLLING AND MONITORING POWER OR ENERGY

BACKGROUND OF THE INVENTION

1. Field of the Invention

This invention is directed to control and monitoring systems and, more particularly, to control and monitoring of loads powered by a panelboard.

2. Background Information

An electrical distribution system within an industrial, commercial or residential property starts at the utility service entrance and ends at the final utilization equipment or loads. The service entrance includes the utility company's watt-meter or kWh meter. Beyond the utility company's meter is a main circuit interrupting device, such as a circuit breaker. The main circuit breaker supplies power to a number of feeder circuits which in turn power a number of branch circuits. In a small system, such as a home, the main circuits directly feed individual branch circuits and no feeder circuits are employed. The electrical utilization loads are normally located on the branch circuits.

An energy management system (EMS) employs on-line or dynamic measurement of the energy consumed by the various electrical loads within the electrical distribution system. With these energy measurements, the EMS may log energy consumption on a per load basis and make load shed or restore decisions based on this information and the desired system strategy. Typically, such strategies involve cost avoidance by energy demand limiting or energy consumption time shifting based on time-of-day energy billing rate structures. Loads which are typically monitored and controlled include water heaters, pool pumps, air conditioners and other cyclic loads which may be time shifted without significantly affecting the energy consumer's comfort level.

The utility's meter forms the "point of common coupling" between the energy supplier (e.g., the utility company) and the energy consumer. Both the energy supplier and the energy consumer have an interest in an efficient energy management system. The utility company has an interest in peak demand limiting or load leveling. The energy consumers are interested in minimizing their energy bill and in having the ability to restore loads shed by the utility company should they choose. Both the utility company and the energy consumers are interested in determining the energy consumption per branch circuit.

Electrical switching devices include, for example, circuit switching devices and circuit interrupters, such as circuit breakers, contactors, motor starters, motor controllers and other load controllers. Circuit breakers are generally old and well known in the art. Examples of circuit breakers are disclosed in U.S. Pat. Nos. 4,553,115; 4,642,726; 4,654,614; 4,887,057; 5,200,724; and 5,341,191. Such circuit breakers are used to protect electrical circuitry from damage due to an overcurrent condition, such as an overload condition or a relatively high level short circuit condition.

Some circuit breakers employ a solenoid having a plunger for engaging a trip mechanism along with a remotely controllable coil for energizing the solenoid. Some circuit breakers employ a status contact for reporting the status of the circuit breaker's separable contacts.

A panelboard holds a plurality of electrical switching devices each of which is connected between one or more power sources and a separate load. An example of an external computer for a panelboard is disclosed in U.S. Pat. No. 4,918,566. It is also known to employ a computer within a panelboard.

It is known to employ electronic control, such as a computer, for controlling the solenoids of a plurality of circuit breakers in a panelboard. It is also known to employ the computer to monitor the status of the circuit breakers in a panelboard from the status contacts.

It is known in EMS systems to provide intelligent demand side management or prediction of which devices are energized and the statistical inhibition of selected devices, although such systems are believed to be either too inaccurate or too expensive to be practical in a commercial or residential EMS system.

There is a need, therefore, for an improved apparatus to monitor branch circuit power or energy consumption and provide on/off control of the branch circuit.

There is a further need for such an apparatus which provides control and monitoring remote from the electrical switching device of the branch circuit.

SUMMARY OF THE INVENTION

These and other needs are satisfied by the invention which is directed to a panelboard apparatus including a means for controlling and monitoring a branch circuit powered through the panelboard. A simple, low cost means for measuring branch circuit power or energy consumption is preferably employed in which a combination of analog and digital circuitry measures power and energy to an accuracy normally associated with more expensive revenue billing meters. Small current sensing transformers are employed to monitor branch circuit current. Line-to-neutral voltage is resistively sensed. Logic is employed to select the proper phase voltage associated with a given phase current to form a single element watt transducer for measuring the associated branch power and energy. Communications may be provided to remotely monitor branch parameters, such as voltage, power and energy consumption. For electrical switching devices which provide the capability to energize or de-energize the branch circuit, these communications also allow this function to be performed remotely in order that the utility company and the energy consumer may remotely monitor and control branch circuit loads.

Remote on/off circuit control is provided by means of a remotely controllable actuating means, such as a circuit breaker or relay. Serial communication based on standard open protocols, such as asynchronous power-line-carrier CEBus and X10, as well as twisted pair INCOM, may be employed. Preferably, a bridging function between different protocols is employed such that a master utilizing a first protocol may control a slave device utilizing a second protocol.

As one aspect of the invention, a panelboard apparatus comprises: a housing; a plurality of electrical switching means housed by the housing, with each of the electrical switching means for switching a circuit from at least one of at least one power line to at least one of a plurality of loads, and with each of at least some of the electrical switching means including remotely controllable actuating means for actuating the each of at least some of the electrical switching means and switching a circuit from at least one of the at least one power line to at least one of the loads; and control and monitoring means substantially housed by the housing comprising: control means for controlling the remotely controllable actuating means of the at least some of the electrical switching means, and monitoring means at least for monitoring power or energy consumed in the circuits of the at least some of the electrical switching means.

Preferably, the at least one power line includes a first voltage line, a second voltage line, and a third neutral line which source a first line-neutral voltage to at least one of the loads and a second line-neutral voltage to another of the loads. A first circuit from the first voltage line to the at least one of the loads has a first load current and a second circuit from the second voltage line to the other of the loads has a second load current. The monitoring means comprises: first and second current sensor means for sensing the first and second load currents in the first and second circuits, respectively, with each of the current sensor means having an output with a current signal; pulse width modulator means interconnected with the first voltage line, the second voltage line and the third neutral line, with the pulse width modulator means having first and second outputs for producing first and second pulse width modulated signals from the first line-neutral voltage and the second line-neutral voltage, respectively; first and second multiplier means each of which has a first input interconnected with the output of one of the first and second current sensor means and a second input interconnected with one of the first and second outputs of the pulse width modulator means, with each of the first and second multiplier means for multiplying one of the current signals of the first and second current sensor means and one of the first and second pulse width modulated signals to produce a first power signal at a first output and a second power signal at a second output, respectively; analog-to-digital conversion means connected to the first and second outputs of the first and second multiplier means, respectively, for converting the first and second power signals to first and second power values, respectively; and processing means for processing the first and second power values.

As another aspect of the invention, a panelboard apparatus comprises: a housing; a plurality of electrical switching means housed by the housing, with each of the electrical switching means for switching a circuit from at least one of at least one power line to at least one of a plurality of loads, and with each of at least some of the electrical switching means including remotely controllable actuating means for actuating the each of at least some of the electrical switching means and switching a circuit from at least one of the at least one power line to at least one of the loads; control and monitoring means housed by the housing comprising: control means for controlling the remotely controllable actuating means of the at least some of the electrical switching means, and monitoring means at least for monitoring power or energy consumed in the circuits of the at least some of the electrical switching means; and management means cooperating with the control and monitoring means for switching the circuit from one of the at least one power line to the at least one of the loads.

The management means and the control and monitoring means may both include one or both of X10 communication means and CEBus communication means therebetween.

BRIEF DESCRIPTION OF THE DRAWINGS

A full understanding of the invention can be gained from the following description of the preferred embodiment when read in conjunction with the accompanying drawings in which.

DESCRIPTION OF THE PREFERRED EMBODIMENT

Figure 1:
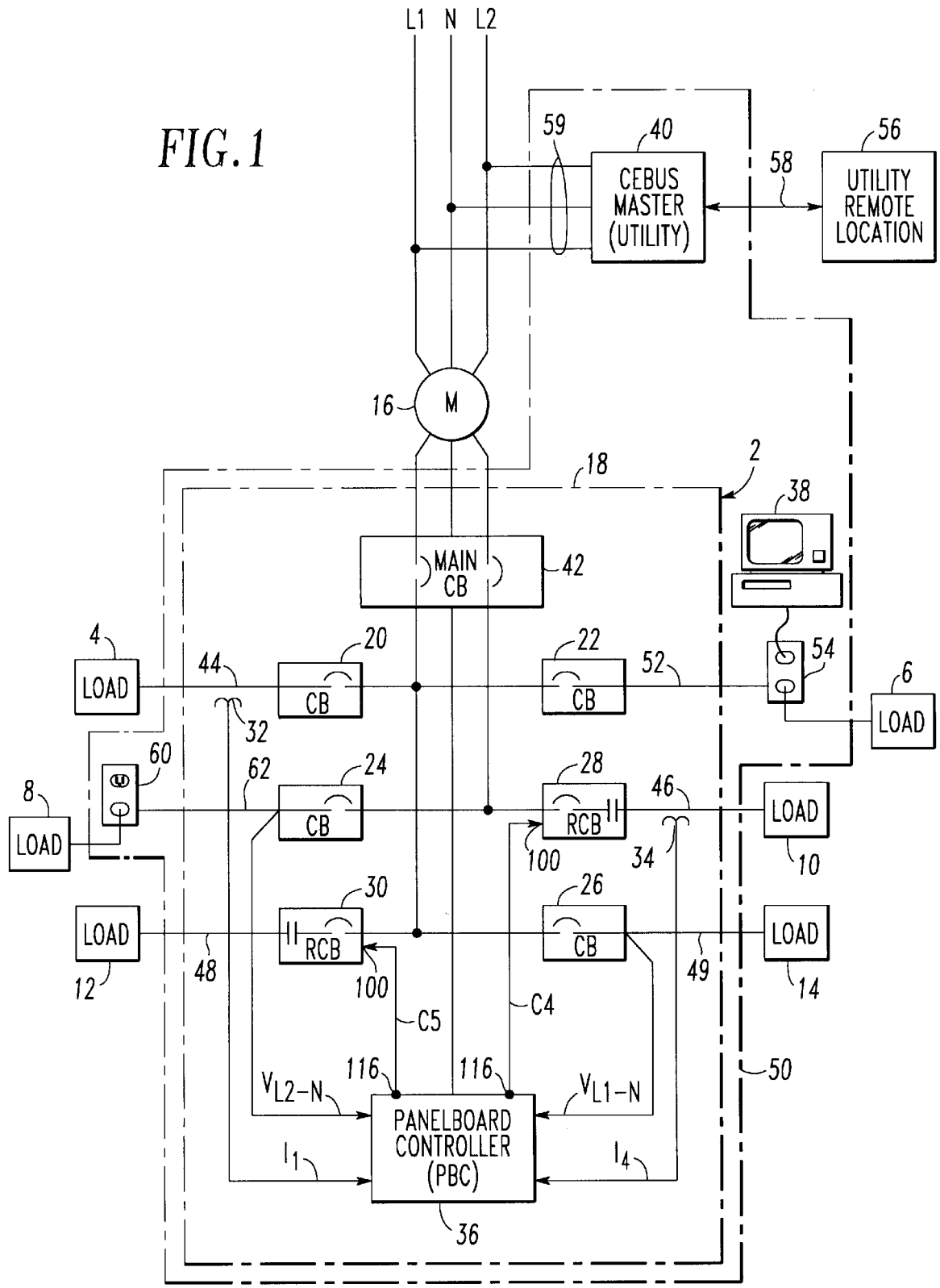
FIG. 1 is a block diagram of an improved panelboard having a plurality of remotely controlled circuit breakers and a panelboard controller in accordance with the invention.

Referring to FIG. 1, a panelboard 2 for exemplary alternating current (AC) power lines L1,L2, neutral line N, and loads 4,6,8,10,12,14 is illustrated. The lines L1,L2,N supply voltage (e.g., conventional 120/240 VAC, single-phase, three-wire) to the panelboard 2 through meter (M) 16. The panelboard 2 includes a box or housing, such as enclosure 18, conventional circuit breakers (CB) 20,22,24,26 and remotely controllable circuit breakers (RCB) 28,30 housed by the enclosure 18, current sensing transformers (CT) 32,34, and a panelboard controller (PBC) 36 at least substantially within the enclosure 18. Although two power lines and six circuit breakers are illustrated, it will be appreciated that a wide variety of power line and circuit breaker counts may be employed. The PBC 36 communicates with remote masters 38,40, monitors (e.g., monitors circuit breaker status, or measures energy, power and line voltage) the CB 20 and RCB 28, and controls the RCBs 28,30, which are discussed below in connection with FIG. 2.

In the exemplary embodiment of FIG. 1, the panelboard 2 has one main circuit breaker (MAIN CB) 42 and six branch CBs 20,22,24,26,28,30, with CBs 20,22,26,30 powered through MAIN CB 42 by line L1, and with CBs 24,28 powered through MAIN CB 42 by line L2. The exemplary branch circuits 44,46 respectively powered through CB 20 and RCB 28 are monitored for power. For example, the output of CT 32 located at branch circuit 44 yields an output $I_1$, proportional to the current in circuit 44, which is fed to PBC 36. Exemplary branch circuit 49 is not monitored. The line-to-neutral voltage $V_{L1-N}$, from the output of CB 26, is also fed to PBC 36. As explained below in connection with FIGS. 3–7, this voltage is employed for: (1) supplying power for PBC 36; (2) monitoring $V_{L1-N}$; and (3) computing the power (and energy) of branch circuit 44 based on the multiplication (and integration) of $I_1$ times $V_{L1-N}$. The branch circuit 46 is similarly monitored by employing $I_4$ from CT 34 and $V_{L2-N}$ from the output of CB 24.

Branch circuits 46,48 employ the RCBs 28,30 and, thus, these circuits may be turned on/off remotely by control outputs C4,C5, respectively. The RCBs 28,30 are slaves in a control and monitoring system 50 which may be controlled and/or monitored by a remote master controller, such as 38 or 40. The first master 38 is an X10 power-line-carrier unit which, in the exemplary embodiment, is a personal computer (PC) of an energy controller. The X10 master 38 is powered through branch circuit 52 which is connected to a conventional AC outlet 54 and load 6. As understood by those skilled in the art, the master 38 employs X10 power line communications and outputs a control signal (i.e., an X10 message) having an addressing scheme consisting of 8 bits, configured as a 4-bit "house code" field and a 4-bit "device code" field, both of which have 16 states.

The panelboard 2 employs one of sixteen house codes, as set by DIP (dual in-line package) switches 154 (shown in FIG. 2) of the PBC 36. The appropriate house code sent by the master 38 selects PBC 36 of panelboard 2. The appropriate device code selects, for example, one of 8 or 16 RCBs, such as 28 or 30, within the panelboard 2, although other slaves, such as 60, may be employed. The PBC 36 employs up to 16 control outputs, such as C4,C5, for interconnection with the control inputs of the RCBs, such as 28,30. When the 4-bit "device code" field (e.g., 5) matches the code (e.g., 5 as predetermined within PBC 36) of one of the RCBs (e.g., RCB 30), PBC 36 employs the corresponding control output (e.g., C5) to select that RCB for on/off control in response to the state of the device code field. Otherwise, when the 4-bit device code field (e.g., 3) does not match the predetermined code of any of the RCBs, the X10 message may be acted upon by a suitable X10 slave, such as 60, which employs the same 4-bit house code as panelboard 2 and the particular (i.e., 3) 4-bit device code.

The second master 40 is a CEBus device of the utility company 56. The CEBus master 40 is interconnected with and powered through two or more of the lines L1,N,L2. As understood by those skilled in the art, the master 40 employs a communication medium 58, such as a wide area network, between the CEBus power-line-carrier local area network 59 and the utility company 56 at a remote location. The communication medium 58 may be any of various systems such as, for example, telephone, fiber optic, cable television or radio frequency (RF).

An X10 slave, such as the exemplary switchable AC receptacle 60 on branch circuit 62, may be controlled by the X10 master 38, as discussed above, or by the CEBus master 40 using the bridging capability of PBC 36, which is discussed below in connection with FIGS. 14D–14E.

An X10 request, sent over the CEBus local network 59 and received by PBC 36, is decoded by PBC 36 and may then be re-transmitted as a standard X10 master-to-slave message to slave 60. As discussed below in connection with FIGS. 2 and 14D–14E, PBC 36 employs modems 143,143A, 143B and transceivers 144,144A,144B associated with respective networks X10, INCOM and CEBus, and facilitates control of the RCBs 28,30 and slave 60 by the masters 38,40.

Figure 2:
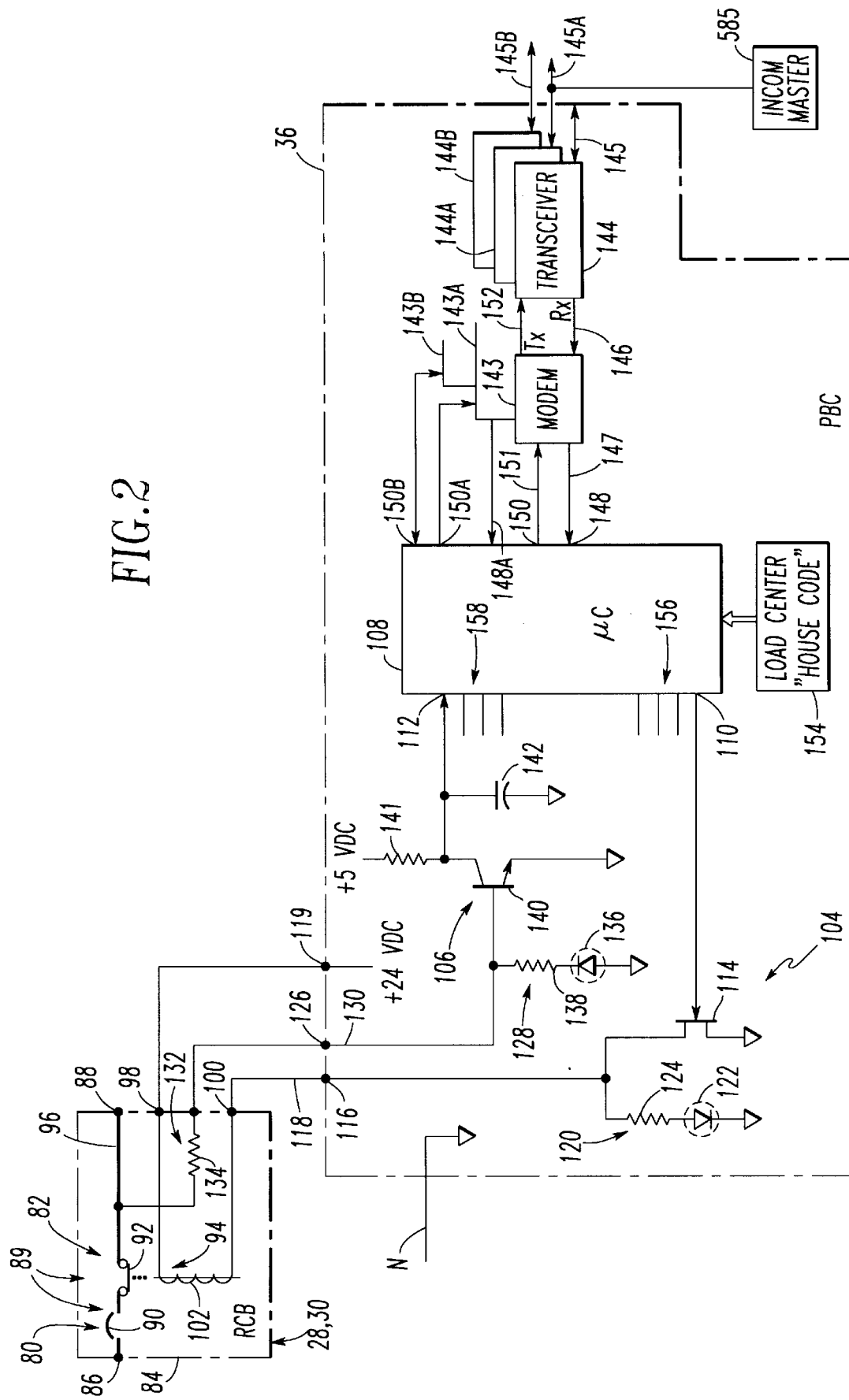
FIG. 2 is a block diagram of a control and monitoring circuit for the remotely controlled circuit breakers of the panelboard controller of FIG. 1.

Referring to FIG. 2, the RCBs 28,30 each consist of a conventional CB 80 in series with a normally closed (NC) contactor 82, both housed within a single enclosure 84 which is interchangeable with the enclosures of the CBs 20,22,24,26 of FIG. 1. An example of an RCB is a model CH120PSD manufactured by Cutler-Hammer. The RCBs 28,30 include a line terminal 86, a load terminal 88 and separable contacts 89 between the line terminal 86 and the load terminal 88. The separable contacts 89 include a first pair of separable contacts 90 in series with a second pair of separable contacts 92, with the CB 80 controlling the separable contacts 90 and the contactor 82 controlling the separable contacts 92. The contactor 82 includes a remotely controllable actuator, such as operating mechanism 94, for actuating the separable contacts 92 and switching a circuit 96 from a power line (not shown) connected to the line terminal 86 to a load (not shown) connected to the load terminal 88. The operating mechanism 94 includes a control input, formed by terminals 98,100, for switching the separable contacts 92, and a coil 102, such as the exemplary 24 VDC coil. The contactor 82 is controlled by the coil 102 such that when voltage is applied to the coil 102 the contactor 82 is opened and the circuit 96 is de-energized.

As shown in FIG. 2, PBC 36 includes a control circuit 104 and a status feedback circuit 106 for each of the RCBs 28,30 (for simplicity of illustration, only one pair of the circuits 104,106 is shown), and a microcomputer ($\mu$C) 108 having digital output 110 and digital input 112. The control circuit 104, which controls the remotely controllable actuator 94 of the RCBs 28,30, interfaces the digital output 110. The control circuit 104 includes an output transistor 114 having a control output 116 with a control signal 118 interconnected with the control input terminal 100 of the operating mechanism 94, and a voltage output 119 with a +24 VDC voltage interconnected with the control input terminal 98 of the operating mechanism 94. When digital output 110 is active, the control signal 118 is pulled to a low state and the +24 VDC voltage across the control input terminals 98,100 energizes the coil 102, thereby opening the NC separable contacts 92. On the other hand, when the digital output 110 is inactive, the control signal 118 is in a high-impedance state which de-energizes the coil 102, thereby maintaining the closed position of the NC separable contacts 92.

The control circuit 104 also includes an indicator circuit 120, formed by LED 122 and series resistor 124, interconnected with the control output 116 for indicating the low (contactor 82 open) and high-impedance (contactor 82 closed) states of the control signal 118. The LED 122, when lit, indicates the high-impedance state of the control signal 118 which de-energizes the coil 102. If transistor 114 is off, LED 122 is lit by current flow (e.g., 1 mA) therethrough which is too small to energize the coil 102. Thus, if LED 122 is lit, the coil 102 is de-energized and the NC contactor 82 is closed. In this manner, the circuit 96 may be de-energized, even with the contactor 82 closed, if the CB 80 is in its opened or tripped position.

The status feedback circuit 106, which monitors the status of the RCBs 28,30, interfaces the digital input 112 of $\mu$C 108. The status feedback circuit 106, which is part of the input or monitoring circuit 125 of FIG. 4, has a status input 126 and an indicator circuit 128 interconnected with the status input 126 for indicating the two states of a status signal 130. The RCBs 28,30 include an electrical interconnection circuit 132 for interconnecting the load terminal 88 with the status input 126 and outputting the status signal 130 thereto. The circuit 132 includes a resistor 134 (e.g., 100KΩ) electrically interconnected between the status input 126 and the load terminal 88. The status signal 130 has a first state when the separable contacts 89, including both 90 and 92, are closed and the circuit 96 is energized, and a second state otherwise. The indicator circuit 128, formed by LED 136 and series resistor 138, indicates the first state of the status signal 130 when the circuit 96 is energized. A current path exists from the load terminal 88, through resistors 134,138 and LED 136, with a return through the neutral line N. The source voltage for this current path is an AC line-to-neutral supply voltage (e.g., line-to-neutral voltage $V_{L1-N}$ or $V_{L2-N}$ of FIG. 1). When circuit 96 is energized, during the exemplary negative half cycle of the AC voltage, LED 136 is lit.

The circuit 106, interconnected between the status input 126 and the digital input 112, includes an input transistor 140, a resistor 141 and a capacitor 142. During the positive half cycle of the AC voltage of circuit 96, the transistor 140 is turned on, thereby discharging capacitor 142 which is otherwise charged by resistor 141 from a +5 VDC voltage. The μC 108 interprets a low voltage on capacitor 142 and digital input 112 as an indication that the circuit 96 is energized.

Referring to FIGS. 1 and 2, the PBC 36, which is part of the control and monitoring system 50, is housed by the enclosure 18. Although external control signals may be sent by external masters 38,40 to PBC 36, and internal status signals may be sent to external masters 38,40 from PBC 36, all or a substantial portion of such control and monitoring may be provided by the PBC 36. The PBC 36 further includes exemplary modems 143,143A,143B and transceivers 144,144A,144B connected to suitable network mediums 145,145A,145B for suitable networks X10, INCOM and CEBus, respectively.

The receiver portion of the transceiver 144 receives a network signal from the network medium 145 and outputs a received signal ($R_x$) 146 to modem 143. The demodulator portion of modem 143 demodulates the received signal 146 and outputs a serial signal 147 to a serial input 148 of μC 108 for serial-to-parallel processing therein. The μC 108 also has a serial output 150 for outputting a serial signal 151 to the modulator portion of modem 143 after parallel-to-serial processing by μC 108. The modulator portion modulates the serial signal 151 and outputs a transmitted signal ($T_x$) 152 to the transmitter portion of the transceiver 144 which transmits a network signal to the network medium 145. Serial input 148A and serial output 150A of μC 108 are employed for interfacing modem 143A. Preferably, the inputs 148, 148A and outputs 150,150A are respective input and output port lines of μC 108 for bit-serial data transfer. The processor memory bus 150B of μC 108 is employed for byte-parallel data transfer to and from modem 143B.

The X10 network employs power lines, such as L1,L2,N of FIG. 1, or branch circuits, such as 52,62 of FIG. 1, for communication of power-line-carrier signals. The exemplary CEBus network 145B employs power lines, such as lines L1,L2,N, as discussed above in connection with FIG. 1. The INCOM network 145A, as described in U.S. Pat. No. 5,315,531 which is incorporated by reference herein, employs a simple two-wire asynchronous communication line which is daisy chained between suitable interfaces, such as an interface to a PC as illustrated by INCOM master 585.

For example, for the X10 network 145, the μC 108 receives the X10 network signal (e.g., an X10 open or close command to a particular "house code" and "device code" through the (e.g., power line communication) transceiver 144 and modem 143), and outputs a corresponding (e.g., open or close RCB) signal on digital output 110 in response to the received X10 network signal to control the appropriate one of the RCBs 28,30. The received X10 message is analyzed by μC 108 to determine if the "house code" within this message matches the address switch settings of DIP switches 154 of the PBC 36. If so, the RCB configuration is set by the corresponding μC digital output, such as 110, which feeds the gate of transistor 114. Although only one output circuit 104 is illustrated, as many as 16 digital outputs, such as 156, may be employed corresponding to the 16 X10 device codes. If the open (close) X10 command requests that the circuit 96 be de-energized (energized), the digital output 110 is set high (low) turning transistor 114 on (off) thereby energizing (de-energizing) the coil 102 which opens (closes) the separable contacts 92. Although exemplary X10 communications have been discussed, it will be appreciated that corresponding CEBus or INCOM communications may be employed.

This status condition of the circuit 96 may be returned to the master of the CEBus network, such as master 40, over the network medium 145B. First, the μC 108 receives the CEBus network signal (e.g., a CEBus retrieve status command corresponding to a particular "house code" and "device code") through the transceiver 144B and modem 143B. If the "house code" corresponding to the received CEBus message matches the address switch settings of DIP switches 154 of the PBC 36, the RCB status is read from the corresponding μC digital input, such as 112, from capacitor 142. Although only one input circuit 106 is illustrated, as many as 16 digital inputs, such as 158, may be employed corresponding to the 16×10 device codes. The CEBus status response, as sent by μC 108 through the modem 143B and transceiver 144B, indicates that the circuit 96 is de-energized (energized) when the μC 108 reads a high (low) voltage on capacitor 142 and digital input 112. Although exemplary CEBus communications have been discussed, it will be appreciated that corresponding INCOM communications may be employed. Similarly, although it is believed that X10 communications do not presently support a retrieve analog data command, as discussed above for CEBus communications, it will be appreciated that such an X10 retrieve analog data command, if implemented by the X10 standard, would be possible, like an X10 retrieve digital (on/off) data command, within the teachings of the present invention.

Figure 3:
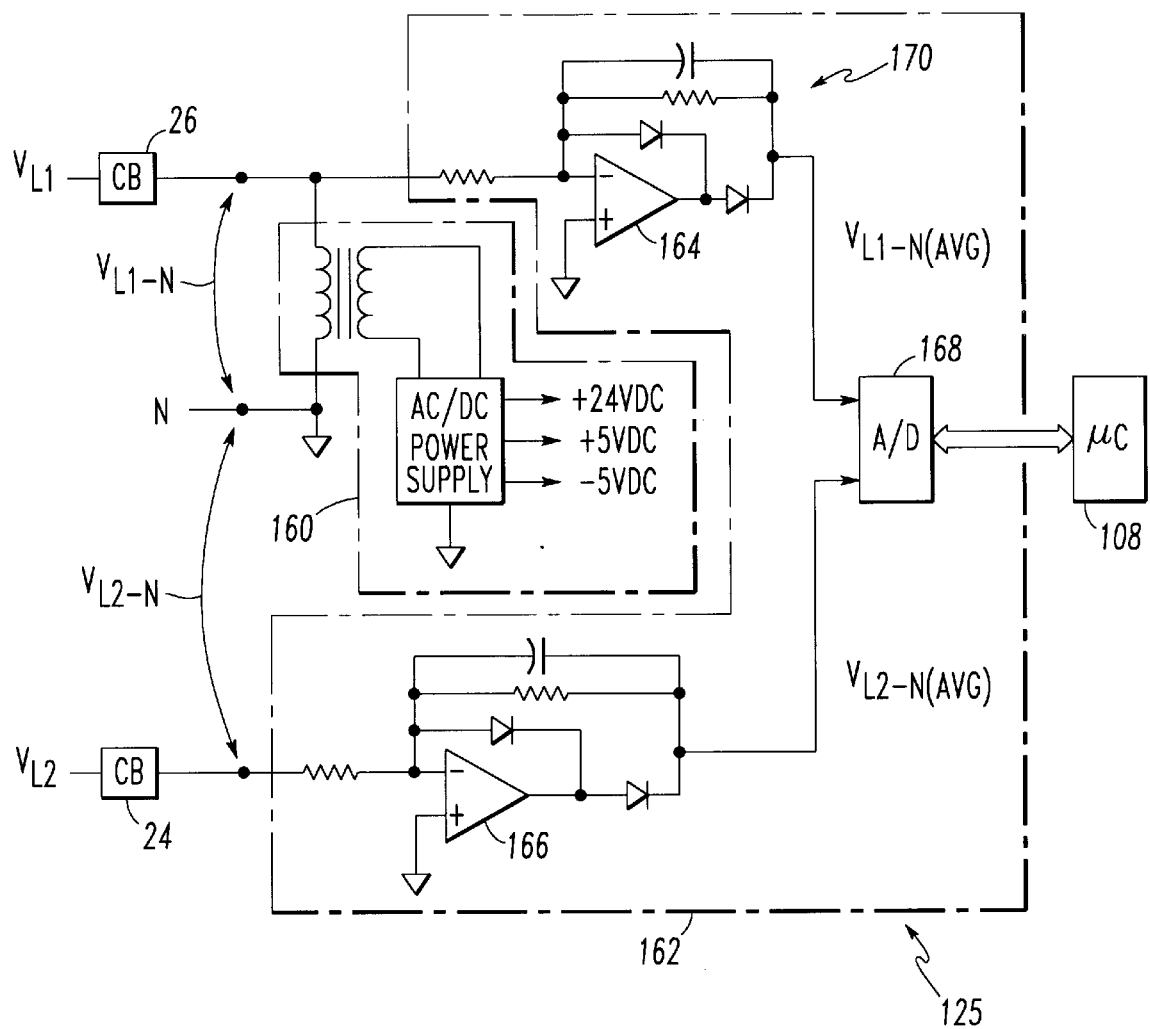
FIG. 3 is a block diagram of a power supply and line voltage monitoring circuit of the panelboard controller of FIG. 1.

Referring to FIG. 3, the PBC 36 of FIGS. 1–2 includes an external 120/240 VAC three-wire power supply along with an internal AC/DC power supply 160 and a line voltage monitoring circuit 162. As shown in FIG. 1, line-to-neutral voltages $V_{L1-N}$ and $V_{L2-N}$ are fed to PBC 36 from the load side of non-switched CBs 26 and 24, respectively. The neutral supply voltage N is the common of PBC 36. The AC/DC power supply 160 derives voltages +24 VDC, +5 VDC and −5 VDC from $V_{L1-N}$. The line voltage monitoring circuit 162 includes operational amplifiers 164 and 166 which determine average analog line-to-neutral voltages $V_{L1-N\ (AVG)}$ and $V_{L2-N\ (AVG)}$ from voltages $V_{L1-N}$ and $V_{L2-N}$, respectively, for analog-to-digital conversion by A/D 168 for μC 108. For example, for the voltage line L1 and neutral line N, which form the voltage $V_{L1-N}$ therebetween, the operational amplifier 164 and associated circuitry form a half wave rectification circuit 170 which determines the average of the absolute value of the voltage between the voltage line L1 and neutral line N.

The converted digital voltage values, in turn, are available for communication by the μC 108 at the request of the remote masters 38,40 of FIG. 1. Although an exemplary 120/240 VAC, three-wire system has been illustrated, it will be appreciated that other voltage ranges and types may be employed. As a further non-limiting example, a 120/208 VAC, four-wire system may be employed in which the input voltages relative to neutral are $V_{AN}$, $V_{BN}$ and $V_{CN}$, there are three operational amplifiers (not shown), and there are three corresponding A/D inputs (not shown).

Figure 4:
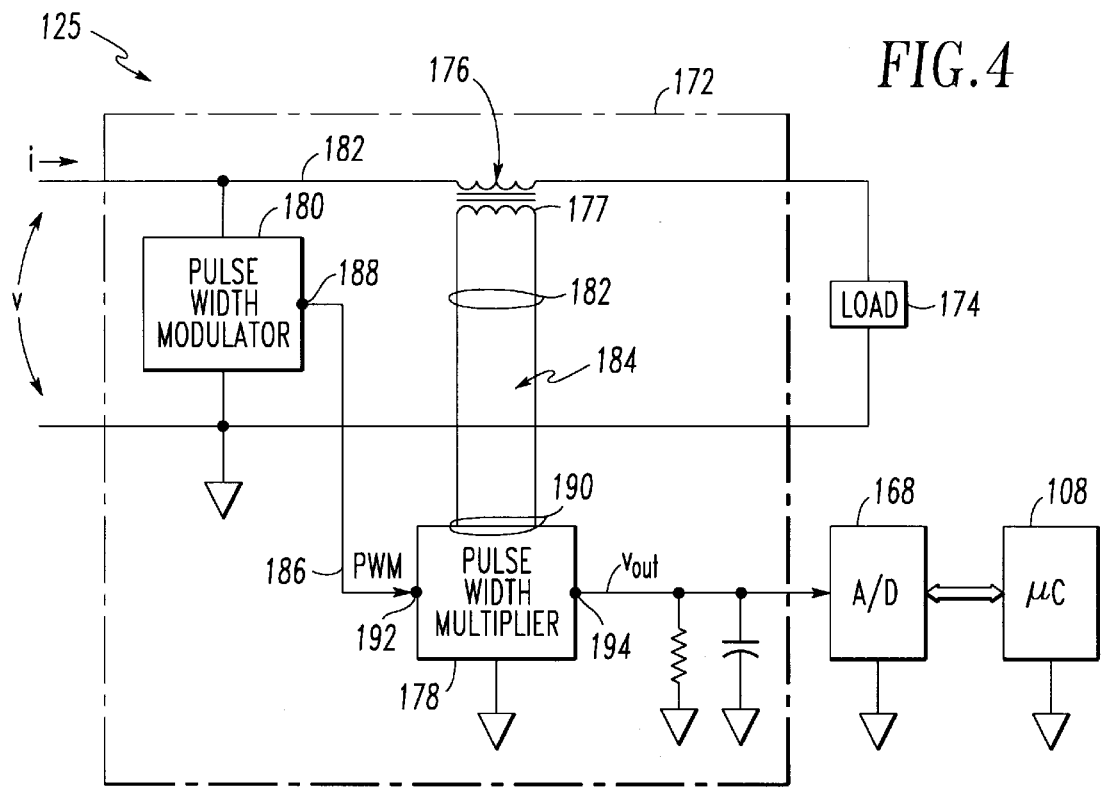
FIG. 4 is a block diagram of a single element power transducer of the panelboard controller of FIG. 1.

As shown in FIG. 4, a basic single element watt transducer circuit 172 is provided for a load 174 having a load current i and a load voltage v. As explained below, the watt transducer circuit 172, A/D 168 and μC 108 are part of the input or monitoring circuit 125 for monitoring power or energy consumed in a circuit, such as the circuits 44,46 of FIG. 1. The watt transducer circuit 172 includes a current sensor 176, such as a current transformer like CTs 32,34 of FIG. 1; an analog pulse width multiplier circuit 178; and an analog pulse width modulator circuit 180. The current sensor 176, which has a secondary 177 forming an output 182 with a current signal 184, senses the load current i to load 174 in the circuit 182. The pulse width modulator circuit 180 is interconnected with the load voltage v (e.g., voltages $V_{L1-N}$ or $V_{L2-N}$) and produces a digital pulse width modulated (PWM) signal 186 at output 188 from such voltage for controlling the multiplier circuit 178. The multiplier circuit 178 has two inputs 190,192 which are respectively interconnected with the output 182 of current sensor 176 and the output 188 of circuit 180 for multiplying the current signal 184 and the PWM signal 186 to produce a power signal $v_{out}$ at output 194. The A/D 168 is connected to the output 194 of circuit 178 for converting the analog power signal $v_{out}$ to a digital power value for processing by μC 108.

Figure 5:
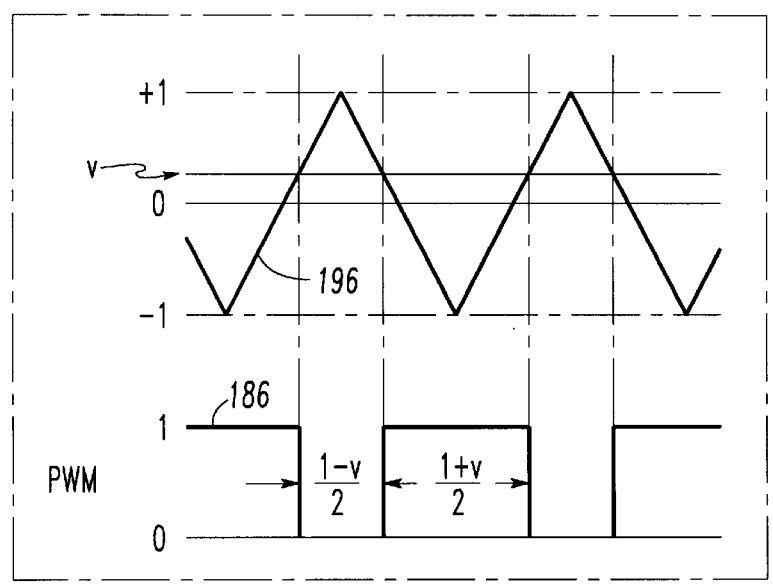
FIG. 5 is a pair of plots illustrating the generation of a pulse width modulated signal by the single element power transducer of FIG. 4.

As shown in FIG. 5, the digital pulse width modulated (PWM) signal 186 has an on state (=1) and an off state (=0). The pulse width modulator circuit 180 of FIG. 4 includes a circuit generating a signal 196 having a triangular waveform, a circuit comparing the instantaneous value of the load voltage v with the signal 196, and a circuit producing the on state of the PWM signal 186 when the load voltage v about exceeds the signal 196, and producing the off state of the PWM signal 186 otherwise. Preferably, the triangular waveform 196 has a relatively high frequency with respect to the frequency of the AC load voltage v, with such frequency being greater than two times the highest line harmonic frequency of interest. When the load voltage v is greater than the signal 196, the PWM signal 186 is a logical 1, else the output is a logical 0. If load voltage v is zero, then the PWM signal 186 has a 50% duty cycle.

Figure 6:
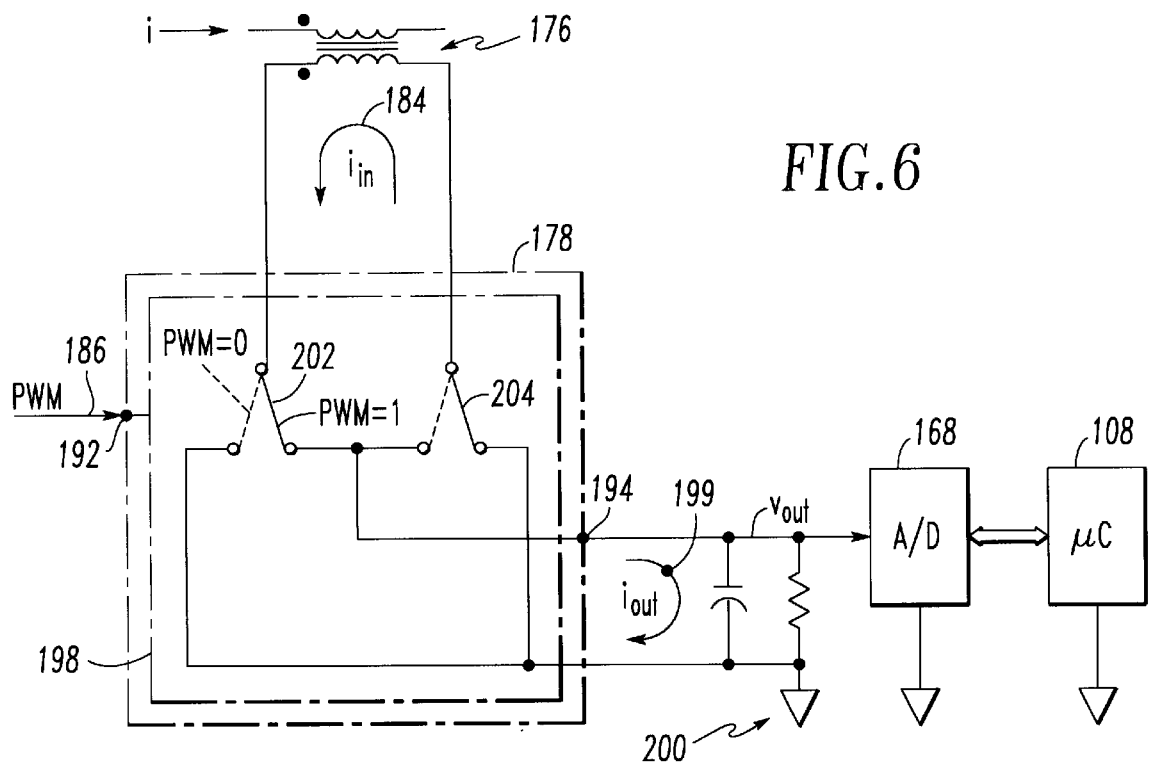
FIG. 6 is a block diagram of a pulse width multiplier circuit of the single element power transducer of FIG. 4.
Figure 7:
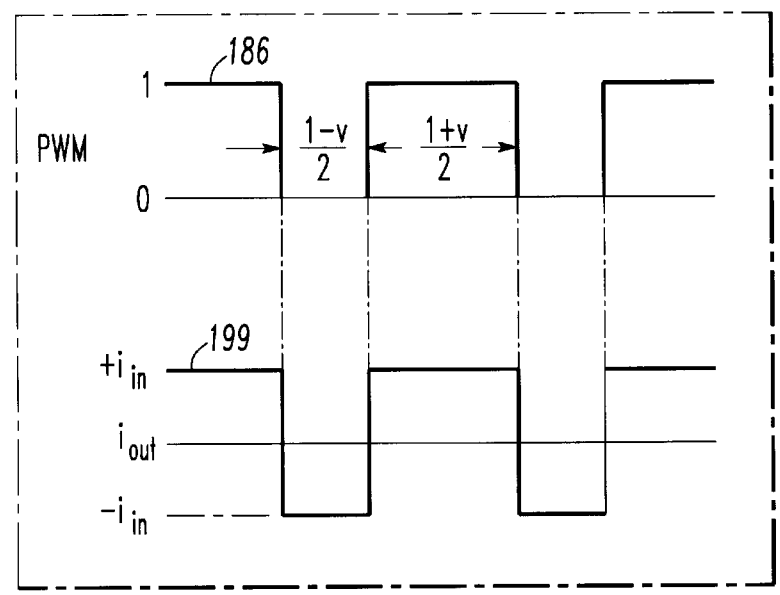
FIG. 7 is a pair of plots illustrating the generation of output current by the pulse width multiplier circuit of FIG. 6.

Referring to FIG. 6, the current signal ($i_{in}$) 184 of current sensor 176 has a magnitude and a sign. The multiplier circuit 178 includes a circuit 198 producing an intermediate signal ($i_{out}$) 199 having a magnitude corresponding to the magnitude of the current signal 184, having a sign equal to the sign of the current signal 184 for the on state of the PWM signal 186, and having a sign opposite from the sign of the current signal 184 for the off state of the PWM signal 186. An R-C circuit 200 averages the intermediate signal 199 to produce the power signal $v_{out}$ at output 194. Preferably, the circuit 198 employs a double-pole, double throw, CMOS switch to switch the current signal 184. With the PWM signal 186 high, the switches 202,204 are in the illustrated position which results in intermediate signal 199 having the same polarity of sign as current signal 184. On the other hand, with the PWM signal 186 low, the switches 202,204 are in the other position (shown in phantom line drawing) resulting in an inversion in the current signal ($i_{in}$) 184 such that the intermediate signal 199 is negative for a positive value of $i_{in}$. For the PWM signal 186 of FIGS. 5 and 6, the resulting waveform of the intermediate signal ($i_{out}$) 199, which varies between either +$i_{in}$ or -$i_{in}$, is illustrated in FIG. 7. The average value of the intermediate signal ($i_{out}$) 199 over one cycle of the triangular waveform 196 of FIG. 5 is a function of the instantaneous values of the load voltage v of FIGS. 4 and 5 and the current signal ($i_{in}$) 184 of FIG. 6 as shown in Equations 1 and 2:

$$\text{avg}(i_{out}) = -i_{in} * (1-v)/2 + i_{in} * (1+v)/2 \quad \text{(Eq. 1)}$$

$$\text{avg}(i_{out}) = i_{in} * V = p \quad \text{(Eq. 2)}$$

wherein:
is instantaneous power into load 174 of FIG. 4

By making the R-C time constant of circuit 200 very large compared to the period of load voltage v, the power signal $v_{out}$ is equal to the average power into the load 174 of FIG. 4.

Figure 8:
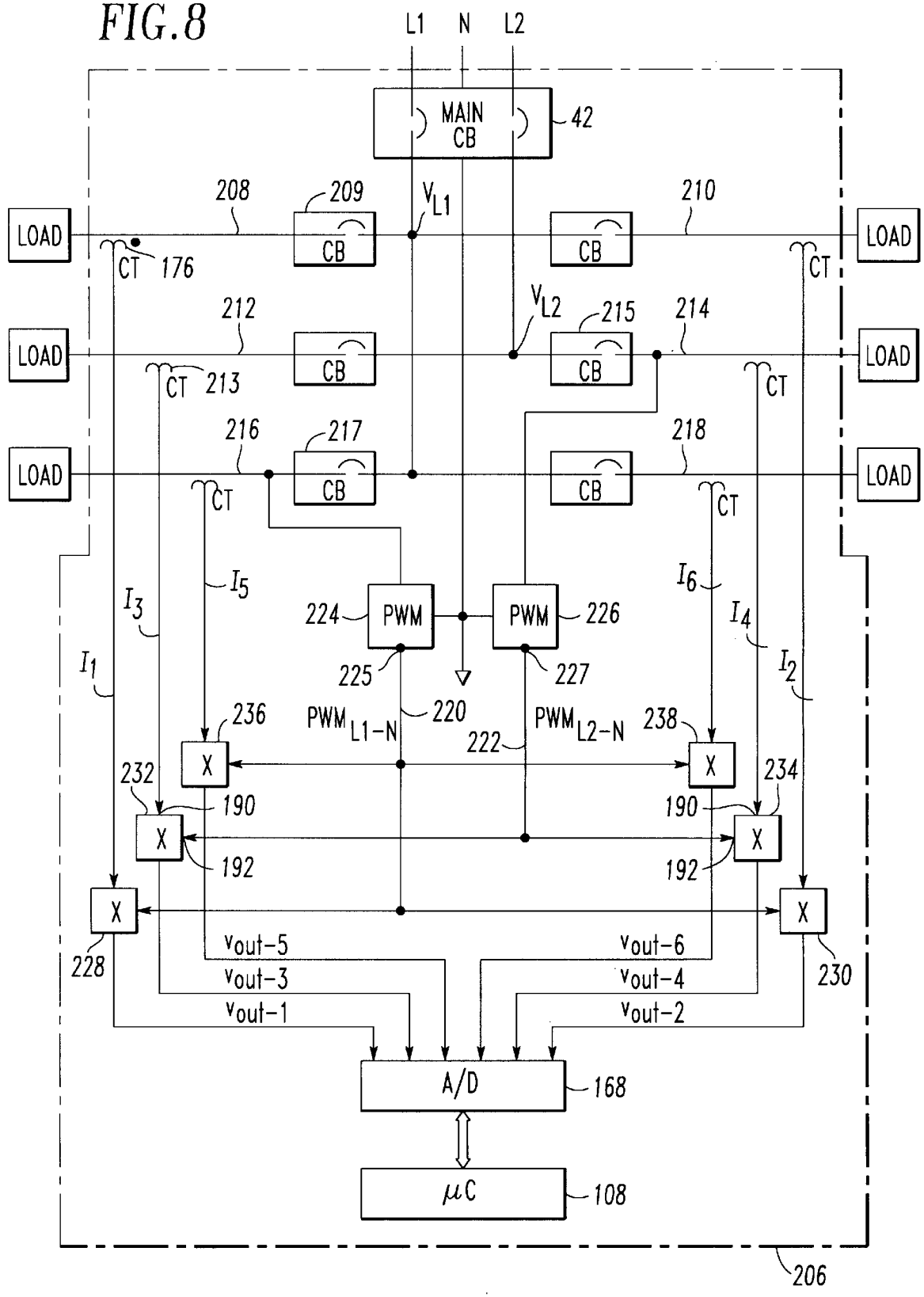
FIG. 8 is a block diagram of a panelboard having multiple line-to-neutral branch circuits in accordance with the invention.

The watt transducer circuit 172 of FIG. 4 employs a current sensor 176 and a PWM signal 186 for each load, such as 174. As shown in FIG. 8, panelboard 206 has six exemplary branch circuits 208,210,212,214,216,218, and each of two PWM signals ($PWM_{L1-N}$) 220 and ($PWM_{L2-N}$) 222 may be shared for all branch circuits fed from respective line-to-neutral voltage $V_{L1-N}$ and $V_{L2-N}$. The PWM circuits 224 and 226, which are interconnected with voltage lines L1 and L2 through CBs 217 and 215, respectively, along with neutral line N, have outputs 225 and 227 for producing the PWM signals 220 and 222 from the line-neutral voltages $V_{L1-N}$ and $V_{L2-N}$, respectively. For the exemplary 120/240 VAC, single-phase system, the two 120 VAC line-to-neutral voltages $V_{L1-N}$, $V_{L2-N}$ are employed to generate the signals $PWM_{L1-N}$, $PWM_{L2-N}$ at the outputs 225,227 of PWM circuits 224,226, respectively. For a 120/208 VAC, three-phase system (FIG. 13), the 120 VAC voltages $V_{AN}$, $V_{BN}$ and $V_{CN}$ are employed to generate respective signals $PWM_{AN}$, $PWM_{BN}$ and $PWM_{CN}$ at the outputs of three PWM circuits.

In the exemplary embodiment of FIG. 8, the exemplary six current signals I1,I2,I3,I4,I5,I6 of the branch circuits 208,210,212,214,216,218 are fed to six pulse width multiplier circuits (X) 228,230,232,234,236,238 which feed power signals $V_{out-1}$, $V_{out-2}$, $V_{out-3}$, $V_{out-4}$, $V_{out-5}$, $V_{out-6}$, respectively, to multi-channel A/D 168 which is controlled by μC 108. Each of the multiplier circuits 228,230,232,234, 236,238 has a first input connected to one of the respective current signals I1,I2,I3,I4,I5,I6 and a second input connected to one of the signals $PWM_{L1-N}$ or $PWM_{L2-N}$. For example, the multiplier circuit 232 providing power signal $V_{out-3}$ has a first input 190 connected to the current signal I3 and a second input 192 connected to signal $PWM_{L2-N}$, as branch circuit 212 is fed from $V_{L2}$. The A/D 168 includes six inputs each of which is connected to the output of one of the multiplier circuits 228,230,232,234,236,238 and a circuit for converting the analog power signals $V_{out-1}$, $V_{out-2}$, $V_{out-3}$, $V_{out-4}$, $V_{out-5}$, $V_{out-6}$ to corresponding digital power values for processing by μC 108. The exemplary A/D 168 is formed from a multi-channel analog multiplexer and a single channel A/D converter, although plural A/D converters or any combination of multiplexers and A/D converters may be employed.

In the panelboard 206 of FIG. 8, the loads of the branch circuits are connected line-to-neutral (e.g., 120 VAC).

Figure 9:
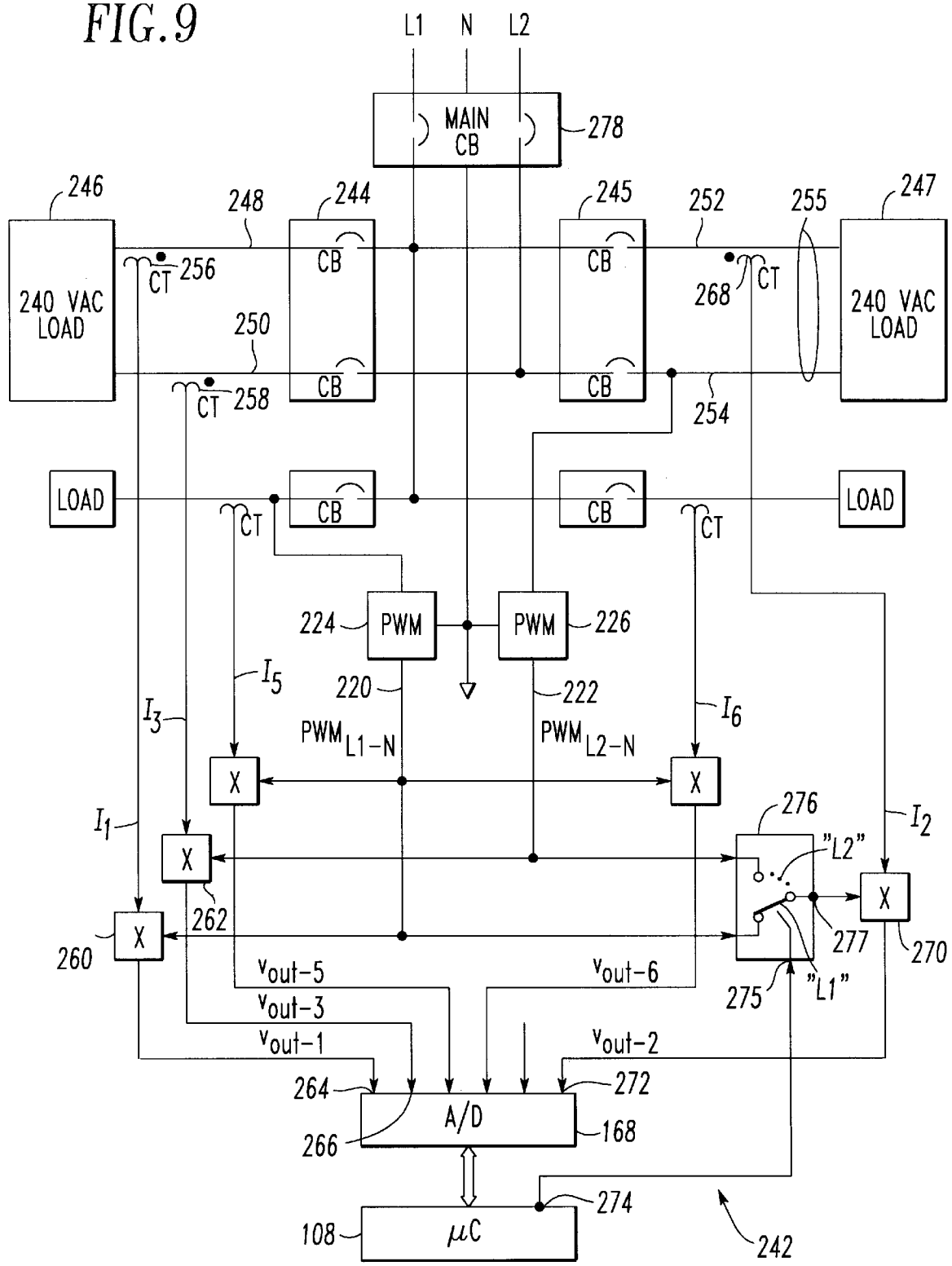
FIG. 9 is a block diagram of a panelboard having line-neutral and line-to-line branch circuits in accordance with the invention.
Figure 13:
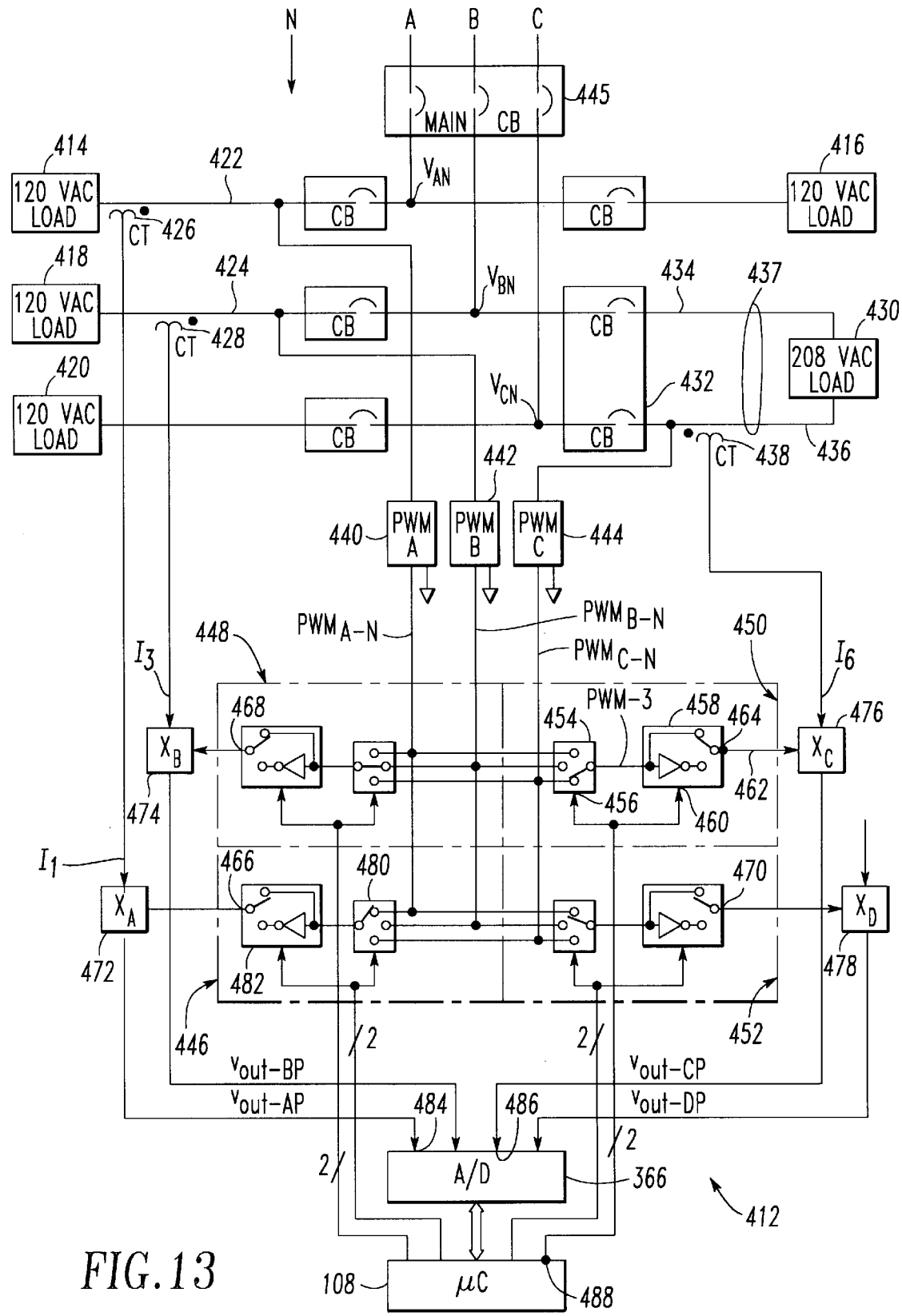
FIG. 13 is a block diagram of a panelboard circuit for automatically selecting voltage in a four-wire system in accordance with another embodiment of the invention.

However, as shown in FIG. 9, other larger loads are connected line-to-line (e.g., 240 VAC single-phase or 208 VAC three-phase as shown in FIG. 13). In the exemplary panelboard 242 of FIG. 9, there are two exemplary ways of handling an exemplary 240 VAC load in a 120/240 VAC system as shown with two-pole circuit breakers 244 and 245. The first configuration is for 240 VAC load 246 and branch circuits 248,250, and the second configuration is for 240 VAC load 247 and branch circuits 252,254 forming a single 240 VAC circuit 255 from power line L1 to load 247 and back to power line L2. In both of these configurations, when the CTs 256,258,268 are suitably oriented, the analog power signals $V_{out-1}$, $V_{out-3}$, $V_{out-2}$ are positive when the selected PWMs 224,226,224 match the line phase connected to the branch circuits 248,250,252, respectively.

The first configuration employs CB 244, two CTs 256, 258, two multipliers (X) 260,262, and two inputs 264,266 of A/D 168. The microcomputer ($\mu$C) 108 reads the digital power values from the A/D 168 corresponding to the analog power signals $V_{out-1}$, $V_{out-3}$ at respective A/D inputs 264,266 and sums the digital power values with sign to compute the total digital power value for load 246. If the load 246 is not a generator and the CTs 256,258 are correctly oriented, as shown, then the signs of the analog power signals $V_{out-1}$, $V_{out-3}$ are both positive.

The second configuration employs CB 245, only one CT 268 for sensing the 240 VAC load current in branch 255, only one multiplier 270, and only one A/D input 272. A digital output 274 of $\mu$C 108, which is interconnected with a control input 275 of 2:1 digital multiplexer 276, is employed to select through multiplexer 276 one of the two signals $PWM_{L1-N}$ or $PWM_{L2-N}$ to be used. The PWMs 224,226 and the multiplexer 276 form a PWM having a single output 277 for input by multiplier 270. If the load 247 is not a generator and the CT 268 is correctly oriented, as shown, the total power for load 247 is the digital power value from the A/D 168 for the analog power signal $V_{out-2}$ at A/D input 272 when the phase select switch 276 is in the "L1" position, as shown, minus the digital power value from the A/D 168 for the analog power signal $V_{out-2}$ at A/D input 272 when the phase select switch 276 is in the "L2" position (shown in phantom line drawing). Preferably, the $\mu$C 108 periodically alternates the state of digital output 274 to obtain the two digital values for this calculation.

In the second configuration, the sign inversion on branch circuit 254 occurs because the current measured in CT 268 is 180° out of phase with respect to the actual current in branch circuit 254. Preferably, in order to provide an accurate measure of the power calculation for load 247, zero or negligible current flows in neutral line N for that load. It will be appreciated that for a three-phase configuration (as shown in FIG. 13), the associated load would still employ a line-to-line voltage, however, the power line would be, for example, $V_{AN}$, $V_{BN}$ or $V_{CN}$. Also, the phase select line for a 3:1 digital multiplexer would select one of three, instead of two, PWM signals for the three phase-to-neutral voltages.

In both of the configurations of FIG. 9, the exemplary A/D 168 converts both negative and positive analog signals. The exemplary watt transducer circuit 172 of FIG. 4 is a true four quadrant design in that the value of $v_{out}$ may be positive or negative depending on the polarities of both $i_{in}$ and v. In the panelboard applications disclosed herein, the load is predominantly a consumer of energy and, thus, the average power into the load should be positive. On the other hand, a negative value of $v_{out}$ indicates that the CT polarity is incorrect. Incorrect phasing of the CTs 256,258,268 may be corrected manually by de-energizing MAIN CB 278, removing the incorrectly installed CT, and reinstalling that CT with the load current passing in the opposite direction.

Figure 10:
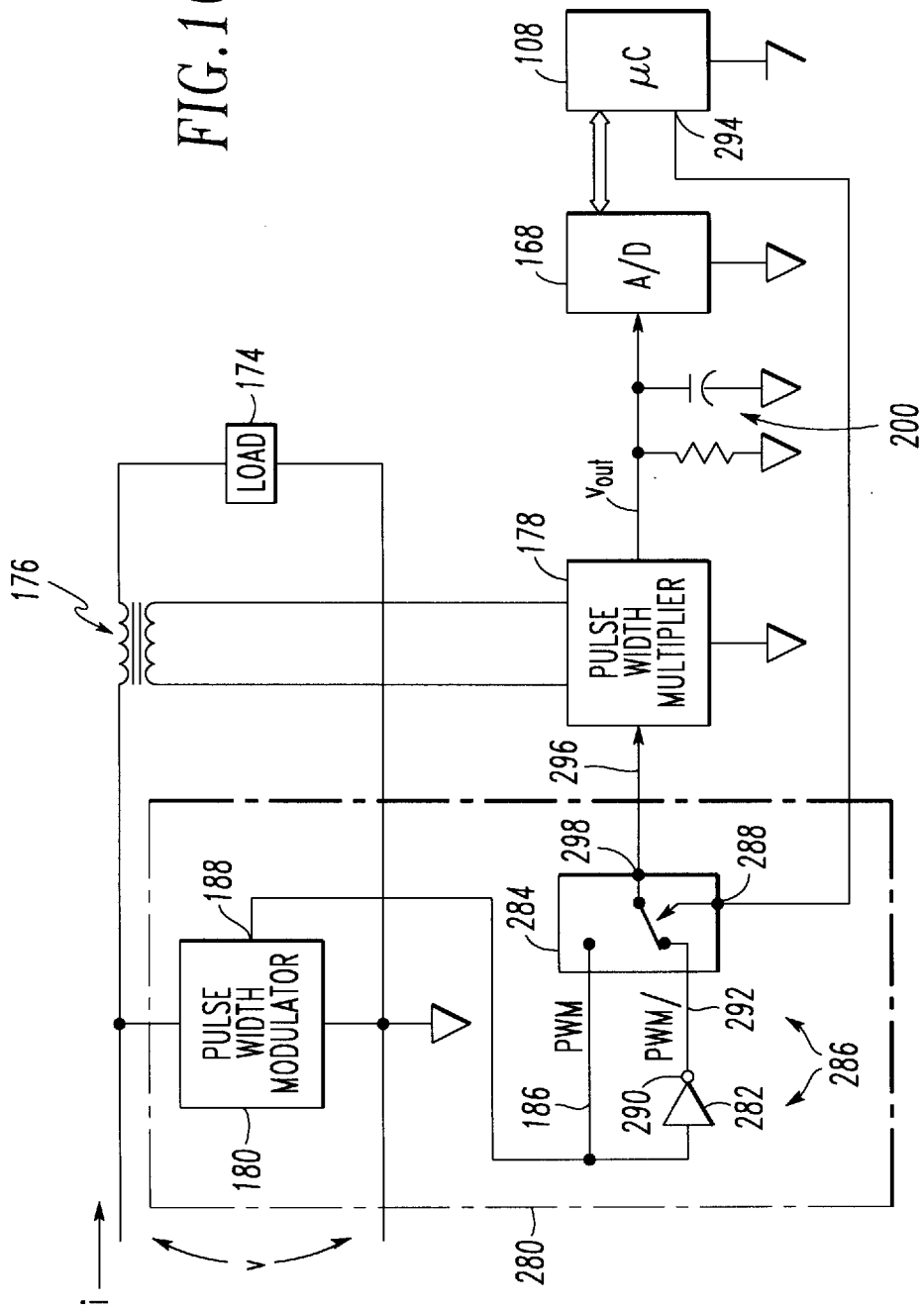
FIG. 10 is a block diagram of a circuit for correcting the polarity of a current transformer in a two-wire system in accordance with the invention.

Referring to FIG. 10, a preferred circuit to automatically correct the phasing of a CT is illustrated. A pulse width modulator circuit 280 includes PWM 180 which produces intermediate PWM signal 186 at output 188 from the line-neutral load voltage v. A digital inverter 282 and 2:1 digital multiplexer 284 form a circuit 286 having a control input 288 for selectively inverting the PWM signal (PWAM) 186. The output 290 of inverter 282 produces an inverted PWM signal (PWM 1) 292. The microcomputer ($\mu$C) 108 has a digital output 294 interconnected with the control input 288 for selectively inverting the PWM signal 296 at the output 298 of multiplexer 284. The $\mu$C 108 selects either PWM or PWM/ and employs that digital value which yields a positive value of $v_{out}$. Once selected, the state of output 294 is remembered by $\mu$C 108 as the improper phasing problem only occurs due to an initial installation error of the CT 176.

The panelboard 206 for the multiple branch circuits 208,210,212,214, 216,218 of FIG. 8 assumes that there is one of the multipliers 228,230,232,234,236, 238 for each of those respective circuits. Typically, a panelboard may accommodate as many as 44 or more branch circuits of which only a few (e.g., heavily loaded circuits such as, for example, a water heater, refrigerator, freezer, pool pump) would need to monitored. In the event that the number of multipliers is less than the number of branches, it is necessary to match a given branch's CT with the appropriate line-to-neutral voltage $V_{L1-N}$ or $V_{L2-N}$. Preferably, automatic selection of the line-to-neutral voltage and, hence, the respective signals $PWM_{L1-N}$ or $PWM_{L2-N}$ is employed. In the exemplary configuration discussed above, there are two possibilities where the real power to the load is greater than or equal to zero (i.e., the load is not regenerative): (1) the phase powering the load is unknown, but the CT polarity is known (e.g., the CT 176 is marked with a "dot" adjacent CB 209); or (2) the CT polarity is unknown, but the phase powering the load is known (e.g., the load of CT 213 is interconnected with line L2). In the first case, for example, if voltage $V_{out-1}$ is positive for the selection of PWM 224, then line L1 is determined. For the second case, for example, if voltage $V_{out-3}$ is positive for the selection of PWM 226, then CT 213 (on line L2) is properly phased.

Figure 11:
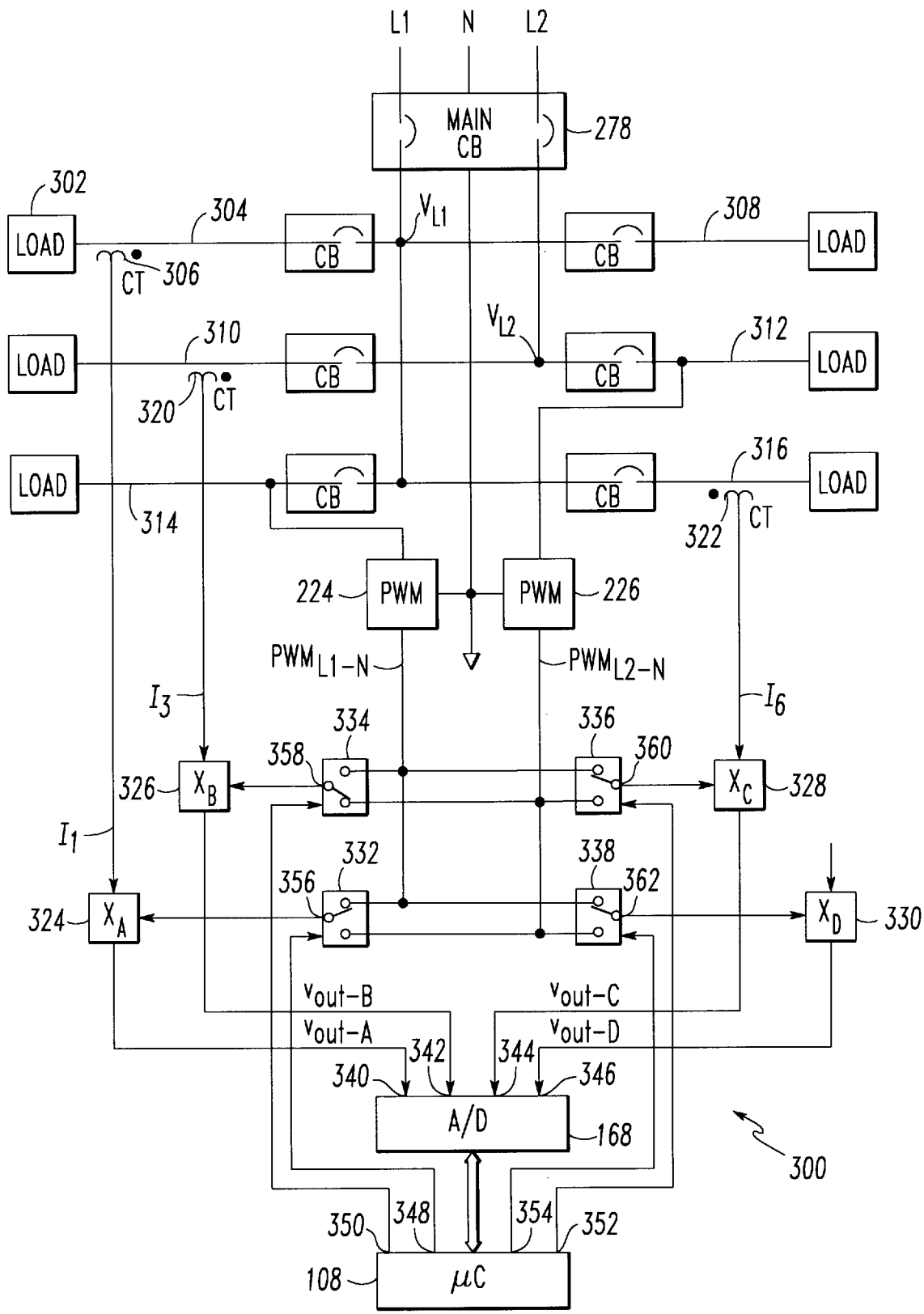
FIG. 11 is a block diagram of a panelboard circuit for automatically selecting voltage in a three-wire system in accordance with an embodiment of the invention.

Referring to FIG. 11, for load 302 on branch circuit 304, if CT 306 is phased properly, as shown, the polarity of $V_{out-A}$ will be positive as it should be if $V_{L1-N}$ is employed by PWM 224 for the power calculation. If, however, CT 306 is improperly phased (not shown), then a positive value $V_{out-A}$ will result if an improper selection of $V_{L2-N}$ is made. In this case, two improper selections result in an incorrect (i.e., the voltage of the wrong phase is employed) positive result. As shown in FIG. 11, it is possible to automatically select the proper one of the signals $PWM_{L1-N}$ or $PWM_{L2-N}$ if the CT, such as 306, is correctly phased.

The exemplary panelboard 300 employs six branch circuits 304,308,310, 312,314,316, three CTs 306,320,322, four multipliers (XA,XB,XC,XD) 324,326,328, 330, and four digital 2:1 multiplexers 332,334,336,338 for the multipliers, respectively. The A/D 168 has inputs 340,342, 344,346 interconnected with the outputs of the multipliers 324,326,328,330 for the signals $V_{out-A}$, $V_{out-B}$, $V_{out-C}$, $V_{out-D}$, respectively. The $\mu$C 108 has digital outputs 348,350,352, 354 interconnected with the control inputs of the multiplexers 332,334,336,338 to select for the multipliers 324,326, 328,330, respectively, one of the signals $PWM_{L1-N}$ or $PWM_{L2-N}$. The PWMs 224,226 and the multiplexers 332, 334,336,338 form a PWM having outputs 356,358,360,362 interconnected with the inputs of the respective multipliers 324,326,328,330.

The selections made through the digital outputs 348,350, 352 are employed to yield positive values for the signals $V_{out-A}$, $V_{out-B}$, $V_{out-C}$, respectively. For the exemplary embodiment of FIG. 11, the proper selections are shown with the multiplexers 332,334,336. For example, as branch circuit 310 is powered from power line L2, the signal $PWM_{L2-N}$ is selected through multiplexer 334. As only three CTs are employed for monitoring three loads, the fourth multiplier $X_D$ 330 is not needed and, thus, the selection of multiplexer 338 is undefined.

The panelboard 206 of FIG. 8 for the six branch circuits 208,210, 212,214,216,218 employs A/D 168 which converts both positive and negative outputs from the multipliers 228,230,232,234,236,238. The $\mu$C 108 strips the sign from the digital power values from the A/D 168 to provide the positive digital power values for the loads of the branch circuits 208,210,212,214,216,218.

Figure 12:
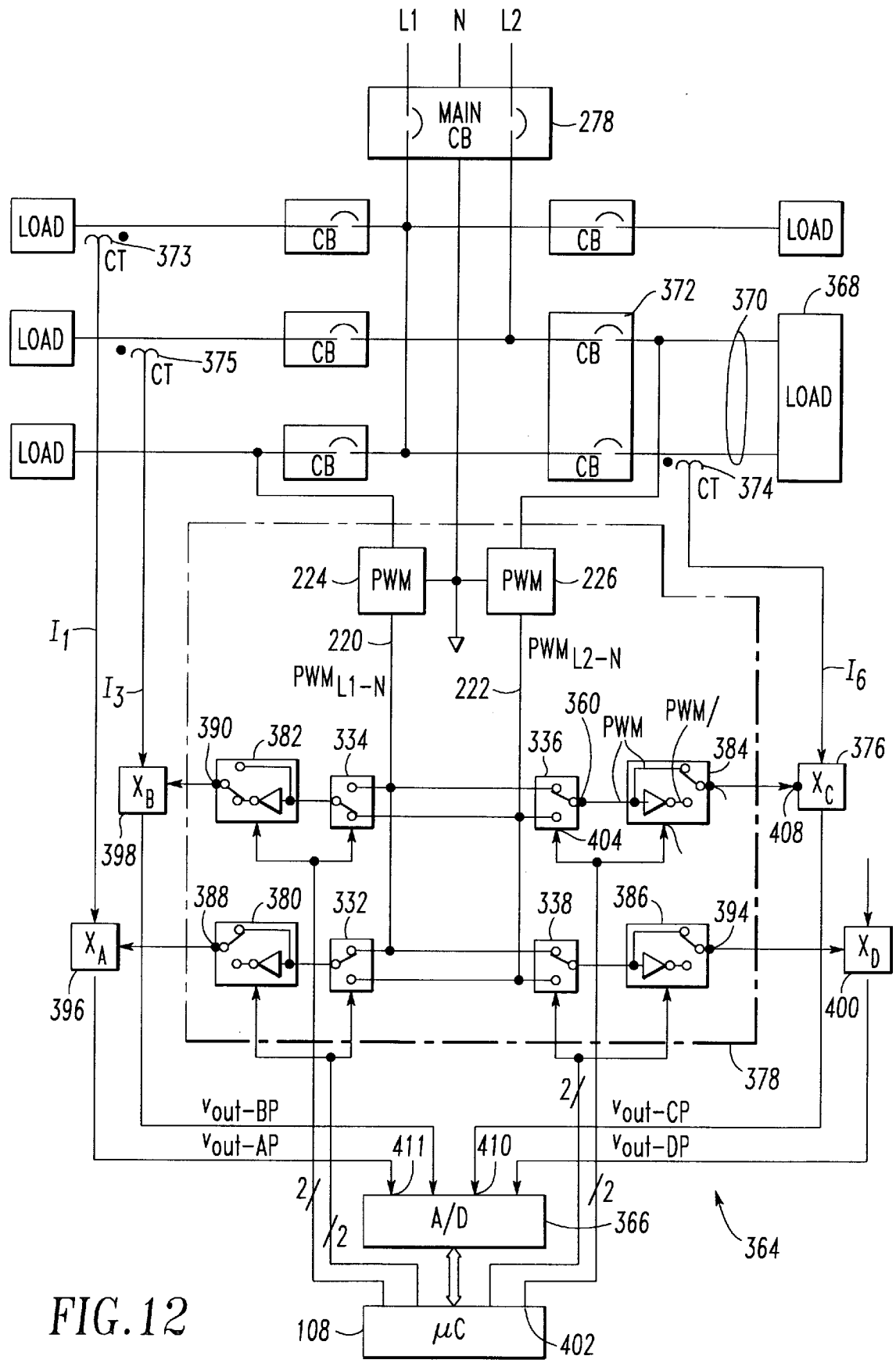
FIG. 12 is a block diagram of a panelboard circuit for automatically selecting voltage and calculating line-line power in a three-wire system in accordance with another embodiment of the invention.

As shown in FIG. 12, the panelboard 364 employs an A/D 366 which only handles positive analog input signals $V_{out-AP}$, $V_{out-BP}$, $V_{out-CP}$, $V_{out-DP}$. An exemplary 240 VAC load 368 is connected to branch circuit 370 powered by power lines L1,L2 through two-pole circuit breaker 372. CT 374 is employed to sense the load current of load 368 and multiplier $X_c$ 376 is employed provide the analog input signal $V_{out-CP}$ for such load. A PWM 378 includes PWMs 224,226, multiplexers 332,334,336,338, and selective inversion circuits 380,382,384,386. The PWM 378 has four outputs 388, 390,392,394 interconnected with the inputs of the respective multipliers 396,398,376, 400. The PWMs 224,226 produce the intermediate pulse width modulated signals $PWM_{L1-N}$, $PWM_{L2-N}$, respectively, for the multiplexers 332,334,336, 338 as discussed above in connection with FIG. 11.

The $\mu$C 108 has a pair of digital outputs for each of the multiplexers 332,334,336,338 and selective inversion circuits 380,382,384,386. For example, the pair of digital outputs 402 control the PWM signal selection and gate one of four PWM signals to the multiplier $X_c$ 376: $PWM_{L1-N}$, $PWM_{L2-N}$, $PWM_{L1-N/}$ and $PWM_{L2-N/}$. The first of the digital outputs 402 is interconnected with the control input 404 of the multiplexer 336 to select one of the intermediate signals $PWM_{L1-N}$ or $PWM_{L2-N}$, and produce another intermediate signal PWM at the output 360 of the multiplexer 336. The second of the digital outputs 402 is interconnected with the control input 406 of the selective inversion circuit 384 which selectively inverts the PWM signal to produce the output pulse width modulated signal (i.e., PWM or PUW/) at the output 392 of PWM 378 for the input 408 of multiplier 376. In turn, two of the four possible $V_{out-CP}$ signals at the output of multiplier 376 will be positive and the other two will be negative. The microcomputer ($\mu$C) 108 reads the two positive digital power values from the A/D 366 corresponding to the analog power signal $V_{out-CP}$ at A/D input 410 and sums these power values with positive sign to compute the total digital power value for load 368. In this case, the CT polarity is not important because if it were inadvertently reversed, then the sign of all four values of $_{out-CP}$ may be selected to be positive through selective inversion circuit 384 and the sum of the two resulting positive power values would provide the correct power. By employing an inverter to selectively invert the PWM signal, this obviates the need for A/D 366 to accept bi-polar signals at inputs such as 410.

Although the exemplary panelboards 300 and 364 of respective FIGS. 11 and 12 are for 120/240 VAC, single-phase, three-wire systems, the invention is applicable to both line-to-neutral and line-to-line loads on, for example, a 120/240 VAC, single-phase system or a 120/208 VAC, three-phase system. The panelboard 412 of FIG. 13 interfaces with three 120 VAC three-phase power lines A,B,C and neutral power line N. The exemplary panelboard 412 interfaces four 120 VAC loads 414,416,418,420 with two branch circuits 422,424 monitored for power through respective CTs 426,428. The panelboard 412 also interfaces a single 208 VAC load 430 powered through two-pole CB 432 on 120 VAC branch circuits 434,436 which form a 208 VAC branch circuit 437. CT 438 on branch circuit 436 is employed to monitor the power to load 430 in branch circuit 437.

The panelboard 412 includes three PWM circuits ($PWM_A$, $PWM_B$, $PWM_C$) 440,442,444 interconnected with the outputs of three-phase MAIN CB 445 and the voltages $V_{AN}$, $V_{BN}$, $V_{CN}$ supplied by power lines A,B,C, respectively. The PWM circuits 440,442,444 produce intermediate PWM signals $PWM_{A-N}$, $PWM_{B-N}$, $PWM_{C-N}$, respectively. For example, $PWM_{CP}$ 444 produces the intermediate PWM signal $PWM_{C-N}$ from the line-neutral voltage between the power line C and neutral line N. Although panelboard 412 is illustrated with a three-phase system, it is also applicable to a two-phase system in which power lines A,B are single-phase power lines L1,L2, respectively. The power values corresponding to PWM signal $PWM_{CN}$ yield zero values for $V_{out-CP}$ and, thus, do not affect the other selections.

In FIG. 13, four exemplary PWM selection circuits 446, 448,450,452 are illustrated. For example, circuit 450 has a 3:1 multiplexer 454 controlled by control input 456 for selecting one of the $PWM_{A-N}$, $PWM_{B-N}$ or $PWM_{C-N}$ signals and producing an intermediate signal PWM-3. The output of multiplexer 454 is interconnected with the input of a selective inversion circuit 458 having a control input 460 for selectively inverting the intermediate signal PWM-3 to produce the pulse width modulated signal 462 at output 464. The circuits 440,442,444 and 446,448,450,452 form a PWM interconnected with the power lines A,B,C and the neutral line N having PWM outputs 466,468,464,470 interconnected with the respective multipliers 472,474,476,478.

The PWM selection circuits 446,448,450,452 and A/D 366 are designed to employ properly phased CTs 426,428, 438, as shown. For example, with the 120 VAC load 414 on power line A, then the value of $V_{out-AP}$ is positive if multiplexer 480 (selecting $PWM_{A-N}$) and selective inversion circuit 482 (selecting no inversion) are selected as illustrated in FIG. 13. The $\mu$C 108 employs the digital power values from the A/D 366 which correspond to the multipliers ($X_A$,$X_B$,$X_C$) 472, 474 and 476 associated with line-to-neutral 120 VAC load 414, line-to-neutral 120 VAC load 418 and line-to-line 208 VAC load 430, respectively. For example, for 120 VAC load 414, the $\mu$C 108 reads the positive digital power value for analog power signal $V_{out-AP}$ at A/D input 484 and obtains the associated total digital power value. For 208 VAC load 430, the $\mu$C 108 reads the positive digital power values for analog power signal $V_{out-CP}$ at A/D input 486 and sums these power values with positive sign to compute the total digital power value for load 430. The $\mu$C 108 employs a pair of digital outputs 488 to control the multiplexer 454 and the circuit 458. The first of the digital outputs 488 is interconnected with the control input 456 of the multiplexer 454 to select one of the intermediate signals $PWM_{A-N}$, $PWM_{B-N}$ or $PWM_{C-N}$ and produce another intermediate signal PWM-3 at the output of the multiplexer 454. The second of the digital outputs 488 is interconnected with the control input 460 of the selective inversion circuit 458. Otherwise, operation of the outputs 488 is similar to the operation of the outputs 402 of FIG. 12.

Figure 14A:
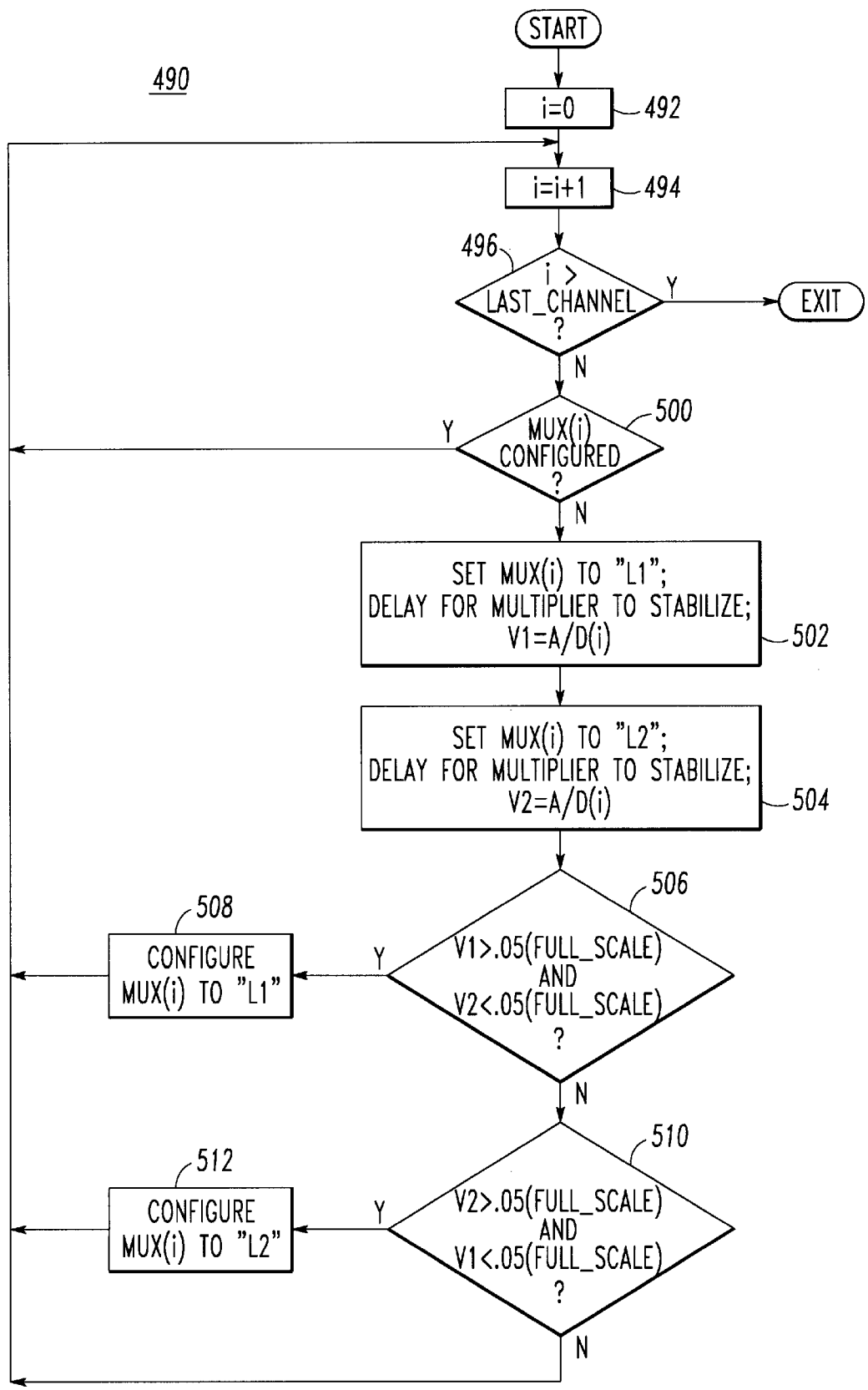
FIG. 14A is a flow chart to automatically select voltage in the three-wire system of FIG. 11.

The flow chart of FIG. 14A illustrates the automatic selection process 490 executed by µC 108 for the embodiment of FIG. 11. At 492, integer i is set to 0 after which integer i is incremented at 494. At 496, if integer i is greater than a predefined integer LAST_CHANAEL (e.g., in the embodiment of FIG. 11, this integer is 4 which equals the count of the four multiplexers 332,334,336,338) routine 490 exits. Otherwise, at 500, if variable MUX(i) was previously configured at either 508 or 512 as discussed below, then execution resumes at 494. Otherwise, at 502, variable MUX (i) is set to "L1" (e.g., output 348 is set to configure multiplexer 332 as shown in FIG. 11), a suitable delay is provided to allow the multiplier (e.g., 324) output to stabilize, and A/D converted digital value V1 is read from A/D input A/D(i) (e.g., A/D input 340). Then, at 504, variable MUX(i) is set to "L2" (e.g., output 348 is set to configure multiplexer 332 opposite from what is shown in FIG. 11), a suitable delay is provided to allow the multiplier (e.g., 324) output to stabilize, and A/D converted digital value V2 is read from A/D input AID (i) (e.g., A/D input 340). Next, at 506, if digital value V1 is greater than 0.05(FULL_SCALE) and digital value V2 is less than 0.05(FULL_SCALE), with FULL_SCALE being the maximum digital value from A/D 168, then variable MUX(i) is set to "L1" at 508 and execution resumes at 494. Otherwise, at 510, if digital value V2 is greater than 0.05 (FULL_SCALE) and digital value V1 is less than 0.05 (FULL_SCALE), then variable MUX(i) is set to "L2" at 512 and execution resumes at 494. If tests 506 and 510 are both not met, then no load has been configured for that channel.

Figure 14B:
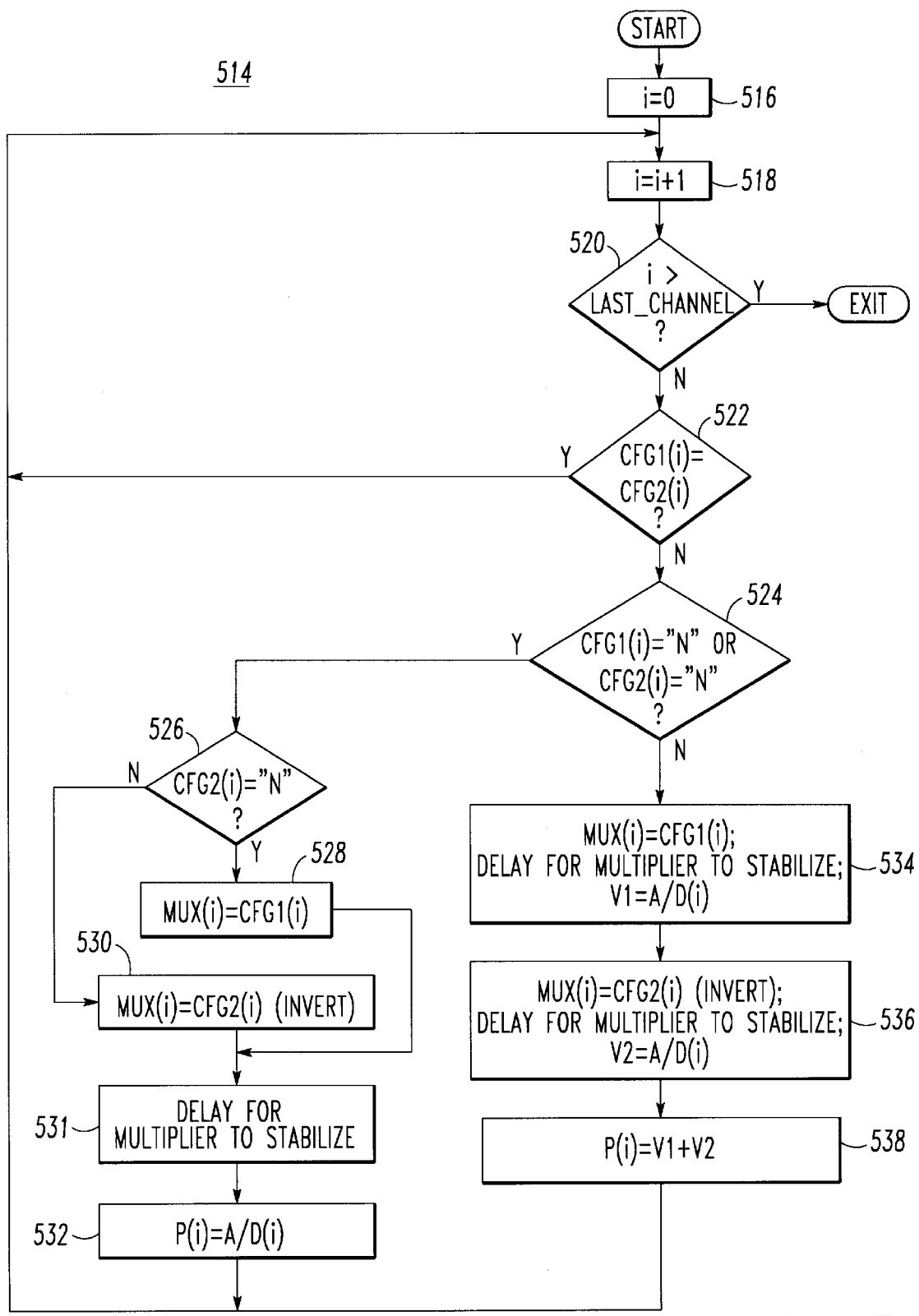
FIG. 14B is a flow chart to automatically select voltage and calculate line-line power in the three-wire system of FIG. 12.

The flow chart of FIG. 14B illustrates the line-line power calculation process 514 executed by µC 108 for the embodiment of FIG. 12. When computing the power in a line-line connected load, such as load 368 of FIG. 12, one of the two multiplications produces a negative result. In the exemplary embodiment of FIG. 12, the power of load 368 is the sum of two positive values: (1) with multiplier $X_c$ 376 connected to intermediate signal $PWM_{L1-N}$; and (2) with multiplier $X_c$ 376 connected to intermediate signal $PWM_{L2-N/}$ (inverted $PWM_{L2-N}$). In the latter case, the "negative" multiplication is made possible by employing the signal $PWM_{L2-N/}$ which is inverted. In turn, summing the two positive values, produces the correct power value from Equation 3:

$$P_{L1-L2} = i * V_{L1-N} + i * V_{L2-N} \qquad (Eq.\ 3)$$

wherein:

$P_{L1-L2}$ is instantaneous power into load 368 of FIG. 12

In process 514 of FIG. 14B, configuration data is stored in two arrays CFG1(i),CFG2(i), with the elements of these arrays defining the configuration of the CTs 373,374,375 of FIG. 12. The permissible values of the elements of these arrays are designated as "L1", "L2", "L3" and "N". The arrays are initialized with the same values for each of the elements of CFG1(i) and CFG2(i) to designate non-configured CTs. Table I shows several examples for CT 373 (i=1), CT 375 (i=2) and CT 374 (i=3):

TABLE I

| integer i | VOLTAGE | ORIENTATION | CFG1[i] | CFG2[i] |
|---|---|---|---|---|
| 1 | $V_{out-AP}$: L1 | proper | L1 | N |
| 2 | $V_{out-BP}$: L2 | reverse | N | L2 |
| 3 | $V_{out-CP}$: L1–L2 | proper | L1 | L2 |

If CT 374 of FIG. 12 were oriented incorrectly (not shown), then the power of load 368 would still be the sum of two positive values: (1) with multiplier $X_c$ 376 connected to intermediate signal $PWM_{L1-N/}$ (inverted $PWM_{L1-N}$); and (2) with multiplier $X_c$ 376 connected to intermediate signal $PWM_{L2-N}$.

Continuing to refer to FIG. 14B, at 516, integer i is set to 0 after which integer i is incremented at 518. At 520, if integer i is greater than a predefined integer LAST-CHANAEL (e.g., in the embodiment of FIG. 12, this integer is 4 which equals the count of the four multiplexers 332, 334,336,338) routine 514 exits. Otherwise, at 522, an illegal configuration is determined if the value of the "i"th element of array CFG1 is equal to the "i"th element of array CFG2. If so, execution resumes at 518.

Otherwise, at 524, a line-neutral (L-N) configuration is determined if the value of the "i"th element of array CFG1 is equal to variable "N" or if the value of the "i"th element of array CFG2 is equal to variable "N" . For a L-N configuration, at 526, if the value of the "i"th element of array CFG2 is equal to variable "N", then at 528, variable MUX(i) is set to the value of the "i" th element of array CFG1 (e.g., "L1", such that the output 388 of selective inverter 380 connects multiplier $X_A$ 396 to intermediate signal $PWM_{L1-N}$). On the other hand, if the value of the "i"th element of array CFG2 is not equal to variable "N", then at 530, variable MUX(i) is set to the inverted value of the "i"th element of array CFG2 (e.g., inverted "L2", such that the output 388 of selective inverter 380 connects multiplier $X_A$ 396 to intermediate signal $PWM_{L2-N/}$ (inverted signal $PWM_{L2-N}$)). Next, at 531, a suitable delay is provided to allow the multiplier (e.g., 396) output to stabilize and, at 532, digital power value P(i) is read from A/D input A/D(i) (e.g., A/D input 411).

If a line-line (L—L) configuration is determined at 524, then at 534, variable MUX(i) is set to the value of the "i"th element of array CFG1 (e.g., "L1", such that the output 392 of selective inverter 384 connects multiplier $X_c$ 376 to intermediate signal $PWM_{L1-N}$), a suitable delay is provided to allow the multiplier (e.g., 376) output to stabilize, and A/D converted digital value V1 is read from A/D input A/D(i) (e.g., A/D input 410). Next, at 536, variable MUX(i) is set to the value of the "i"th element of array CFG2 (e.g., inverted "L2", such that the output 392 of selective inverter 384 connects multiplier Xc 376 to intermediate signal $PTM_{L2-N/}$ (inverted $PWM_{L2N}$)), a suitable delay is provided to allow the multiplier (e.g., 376) output to stabilize, and A/D converted digital value V2 is read from A/D input A/D(i) (e.g., A/D input 410). Then, at 538, digital power value P(i) is calculated by summing digital values V1 and V2. After 532 or 538, 518 is repeated to calculate power for the next multiplexer channel.

Figure 14C:
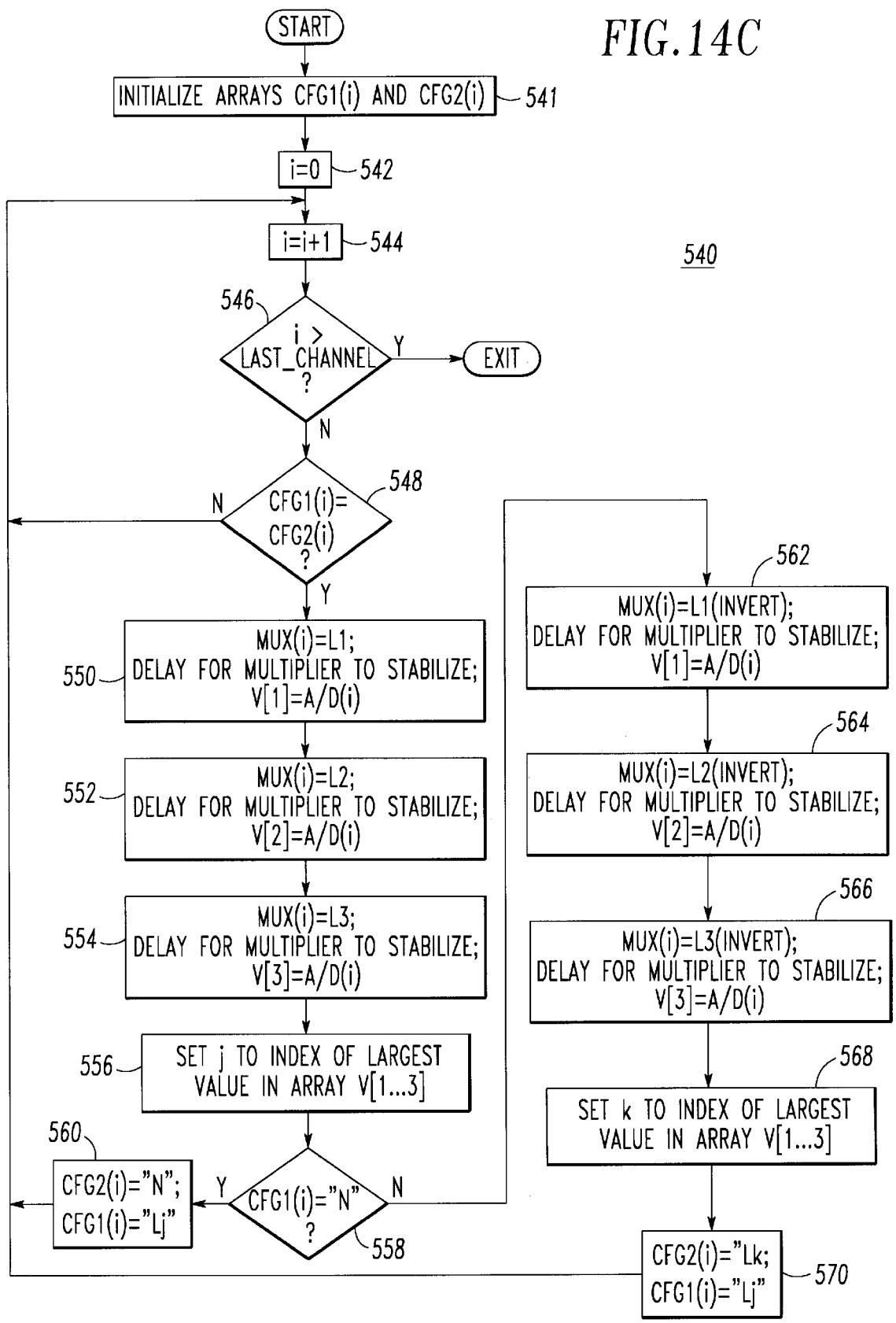
FIG. 14C is a flow chart to automatically select voltage in the four-wire system of FIG. 13.

The flow chart of FIG. 14C illustrates the automatic configuration process 540 for the three-phase panelboard embodiment of FIG. 13. In this embodiment, the power factor of the loads, such as load 430, drawing load current is preferably greater than 0.9 (i.e., with a phase shift of less than 25°). The CTs 426,428,438 are properly oriented as shown in FIG. 13. In this manner, the properly oriented CT (e.g., CT 426) produces through the corresponding multiplier (e.g., multiplier $X_A$ 472) a positive analog power signal (e.g., $V_{out-AP}$) therefrom when the selected one of PWMs 440,442,444 (e.g., 440) matches the line phase (e.g., $V_{AN}$) connected to the branch circuit of that CT.

In process 540, configuration data is stored in two arrays CFG1 (i),CFG2(i), with the elements of these arrays defining the configuration of the CTs 426,428,438. The permissible values of the elements of these arrays are designated as "L1", "L2", "L3" and "N". At 541, the arrays are initialized, for a line-neutral CT (e.g., CT 426), by placing "N" in both elements of CFG1 (i) and CFG2(i) (e.g., with i=1). For a line-line CT (e.g., CT 438), the arrays are initialized by placing "L1" in both elements of CFG1(i) and CFG2(i) (e.g., with i=3).

At 542, integer i is set to 0 after which integer i is incremented at 544. At 546, if integer i is greater than a predefined integer LAST-CHANNEL (e.g., in the embodiment of FIG. 13, this integer is 3 which equals the count of the three active multipliers 472,474,476, with multiplier 478 not being connected to a CT in this embodiment) the routine 540 exits. Otherwise, at 548, a non-configured multiplexer (MUX(i)) is determined if the value of the "i" th element of array CFG1 is equal to the "i"th element of array CFG2. If so, execution resumes at 550. Otherwise, step 544 is repeated.

At 550,552,554, an array V[j], for integer j=1,2,3, of A/D converted digital voltage values corresponding to the selection of PWMs 440,442,444, respectively, by one of the 3:1 multiplexers, such as 480, is determined. At, 550, variable MUX(i) is set to "L1", such that the output 466 of selective inverter 482 connects multiplier $X_A$ 472 to intermediate signal $PWM_{A-N}$, a suitable delay is provided to allow the multiplier (e.g., 472) output to stabilize, and array element V[1] is read from A/D input AID(i) (e.g., A/D input 484). Steps 552,554 perform similar operations as step 550 except that the variable MUX(i) is set to "L2","L3" such that the output 466 of selective inverter 482 connects multiplier $X_A$ 472 to determine array elements V[2], V[2], respectively. Next, at 556, integer j is set to index the largest value in array V[j]. For this case, where the load of the CT is line-neutral connected, only the correct phase (e.g., $V_{AN}$) produces a positive power reading. The 120° phase shifts for the other two phases produce negative power readings.

At 558, a line-line or line-neutral configuration is determined by comparing CFG1 (i) and "N". If these are equal, then there is a line-neutral configuration and, at 560, element CFG2(i) is set to "N" and element CFG1(i) is set to "Lj". For example, for i=1and multiplier $X_A$ 472, then element V[1] has the largest value (i.e., because elements V[2], V[3] are negative) and j=1. Hence, element CFG1(1) is set to "L1" in this example. On the other hand, if a line-line configuration is determined at 558 with CFG1(i) (e.g., "L1" as initialized at 541) not equal to "N", then the phase of the other line is determined at 562,564,566,568.

If, at 558, the load of the CT is determined to be line-line, then the array V[k], for integer =1,2,3, of A/D converted digital voltage values is computed again for each of the three phases using inverted PWM signals. This produces a relatively large positive power reading only for the phase of the load which was not identified at 556. For line-line loads, proper polarity of the CT 438 is not required as the two phase selections produce relatively large positive values, provided that the power factor is near unity. Preferably, CTs are manually configured for loads with power factors less than 0.9.

At 562, variable MUX(i) is set to inverted "L1", such that, for example, the output 464 of selective inverter 458 connects multiplier $X_c$476 to intermediate signal $PWM_{A-N/}$ (inverted $PWM_{A-N}$), a suitable delay is provided to allow the multiplier (e.g., 476) output to stabilize, and array element V[1] is read from A/D input A/D(i) (e.g., A/D input 486). Steps 564,566 perform similar operations as step 562 except that the variable MUX(i) is set to inverted "L2" or inverted "L3" such that the output 464 of selective inverter 458 connects multiplier $X_c$476 to determine array elements V[2], V[3], respectively. Next, at 568, integer k is set to index the largest value in array V[k]. For this case, where the load of the CT is line-line connected, the phase conductor on which the CT is properly installed produces a relatively large positive reading. The other phase of the line-line load produces a relative large negative reading. The unrelated phase produces a relatively small reading, which may be either positive or negative depending on the power factor, or zero for unity power factor. At 570, element CFG2(i) is set to "Lk" and element CFG1(i) is set to "Lj". For example, for i=3 and multiplier $X_c$ 476, then (1) from 556, for j=3, element $V_3$ has the largest value (i.e., because element V[1] is about zero and element V[2] is negative); and (2) from 568, for k=2, element V[2] has the largest value (i.e., because element V[1] is about zero and element V[3] is negative). Hence, element CFG2(3) is set to "L2" and element CFG1(3) is set to "L3" in this example.

Figure 14D:
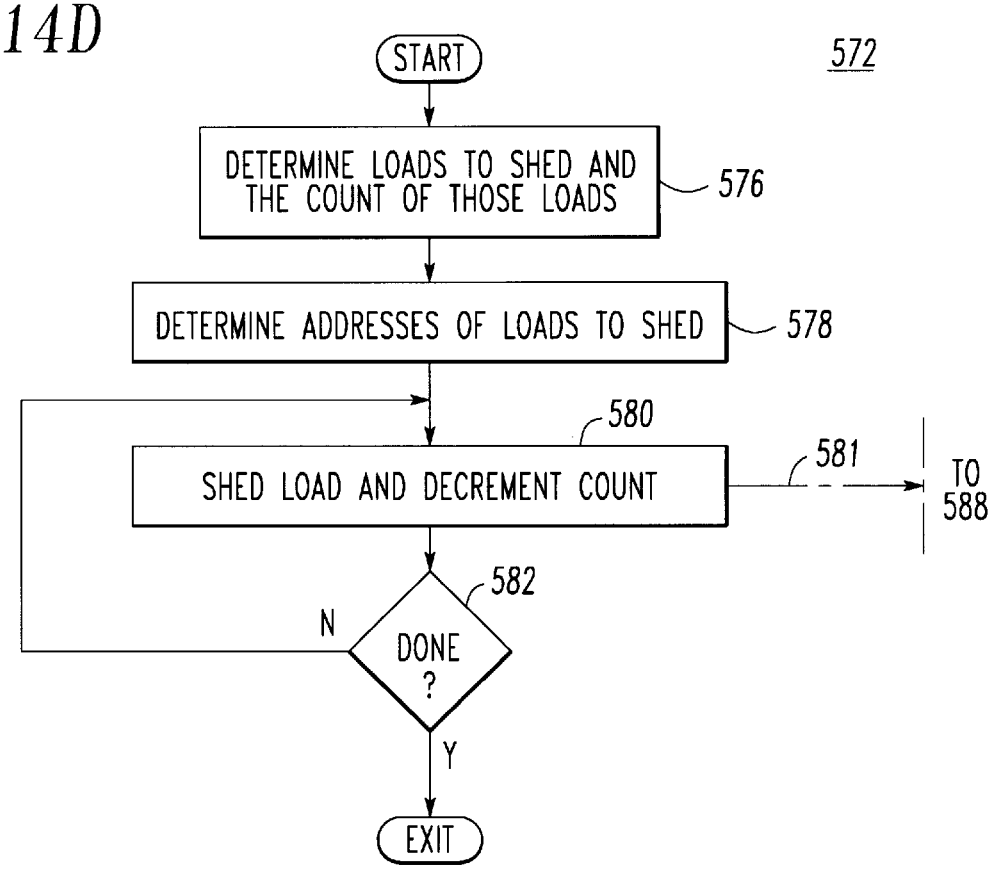
FIGS. 14D and 14E are flow charts of a management routine and a control and monitoring routine, respectively, which switch circuits from the power lines to the loads of FIG. 1.
Figure 14E:
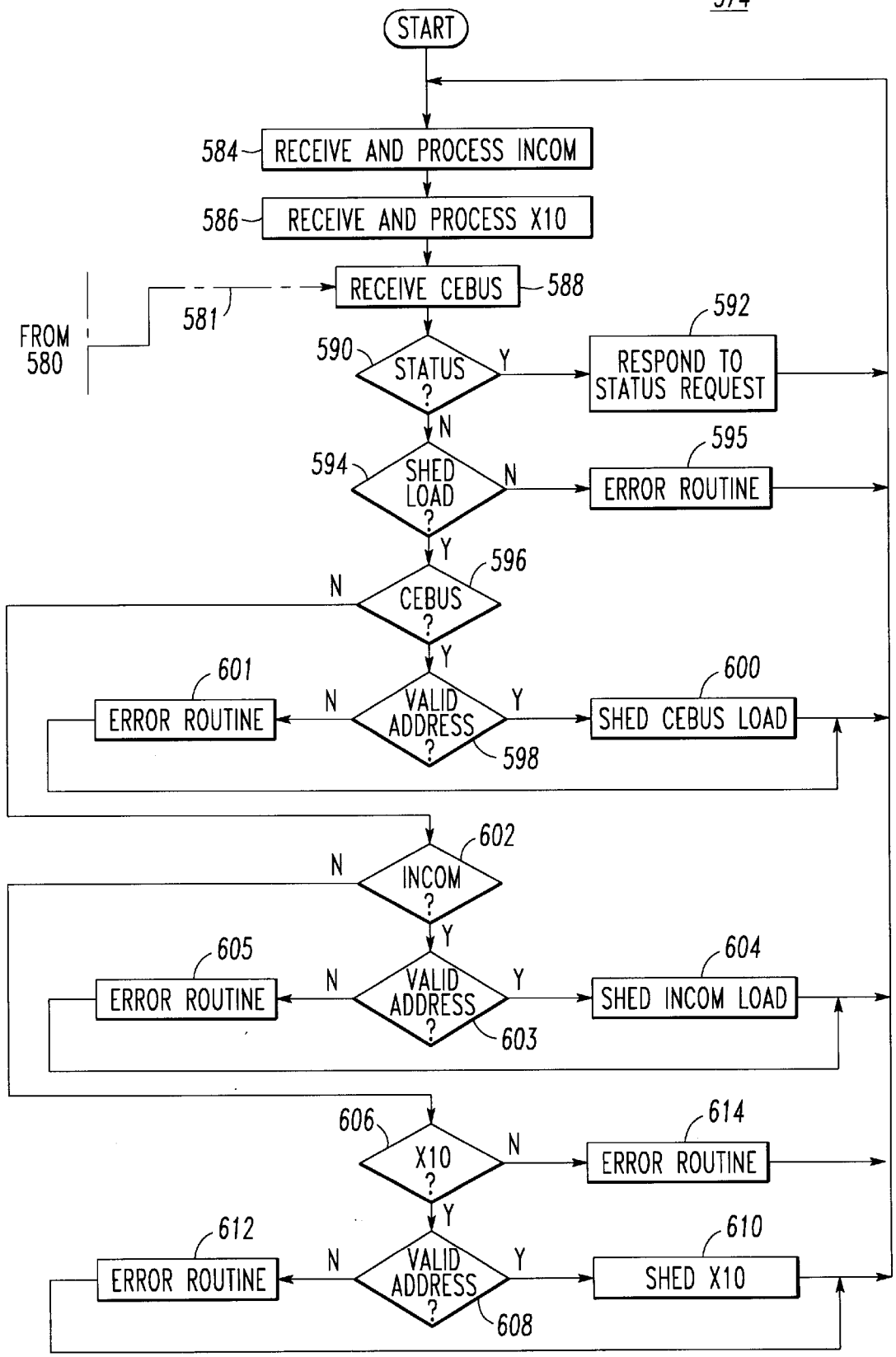

Referring to FIGS. 14D–14E, a management process 572 of the CEBus master 40 cooperates with a control and monitoring process 574 of the PBC 36 of FIG. 2 to switch branch circuits (e.g., 46,48,62 of FIG. 1) from the power lines (e.g., L2,L1,L2) to the loads (e.g., 10,12,8 or 60, respectively). Although the CEBus master 40 is discussed, it will be appreciated that the PBC 36 and masters 38,40 both include one or more sets of modems and transceivers therebetween, such as the modems 143,143A,143B and transceivers 144,144A,144B of PBC 36 shown in FIG. 2.

As shown in FIG. 14D, the CEBus management process 572 determines which loads to shed at 576 along with a count of those loads. Next, at 578, the CEBus address (or CEBus/X10 or CEBus/INCOM address) of each of those loads is determined. For example, the address may include the CEBus address of the PBC 36 and the X10 address (e.g., an X10 4-bit "house code" field and a 4-bit "device code" field) of the load. At 580, the load is shed by sending the appropriate control signal 581, such as the exemplary CEBus request message, to PBC 36 and the count of 576 is decremented. Then, at 582, if not all of the loads have been shed (i.e., the count of 580 is greater than zero), then 580 is repeated. Otherwise, process 572 exits.

Referring to FIG. 14E, the monitoring process 574 is illustrated. At 584, 586 and 588, requests from the INCOM master 585 of FIG. 2 are received and processed, requests from the X10 master 38 of FIG. 1 are received and processed, and requests from the CEBus master 40 of FIG. 1 are received from the modems 143A, 143,143B, respectively. After a CEBus request is received at 588, it is determined whether that CEBus request is a status request at 590. If so, a response is formatted and returned to master 40 at 592. Otherwise, if the request is to shed (or restore) a load at 594, then at 596 it is determined if the address of the load is a CEBus or non-CEBus address. On the other hand, if the request is something other than a status request or a shed (or restore) load request, then an error routine is executed at 595.

If the address is a CEBus address, then, at 598, it is determined whether there is a valid CEBus address. For example, the CEBus address may be a name, such as HOT_WATER_HEATER, which is known to PBC 36 of FIG. 1 and which is associated with one of the RCBs 28,30. If so, the CEBus load is shed (or restored) by opening (or closing) the appropriate RCB at 600. Otherwise, an error routine is executed at 601.

On the other hand, if a non-CEBus address is determined at 596, then an INCOM address is checked at 602. If there is an INCOM address, then, at 603, it is determined if there is a valid INCOM address. For example, the INCOM address may be a name, such as POOL_PUMP, which is known to PBC 36 of FIG. 1 and which is associated with one of the RCBs 28,30. If so, then, at 604, the INCOM load is shed (or restored) by opening (or closing) the appropriate RCB at 604. Otherwise, an error routine is executed at 605.

On the other hand, if there is an X10 address, then, at 608, it is determined if there is a valid X10 address. For example, the X10 address may be a name, such as AIR_CONDITIONER, which is known to PBC 36 of FIG. 1 and which is associated with one of the RCBs 28,30 or with one of the X10 slaves, such as 60. If so, then, at 610, the X10 load is shed (or restored) by opening (or closing) the appropriate RCB at 610 or by sending an X10 shed (or restore) load message to the X10 slave. Otherwise, an error routine is executed at 612. If the address is not CEBus, INCOM or X10 as determined at 596, 602 or 606, respectively, then an error routine is executed at 614.

As another non-limiting example, the CEBus request may be sent along with a particular X10 "house code" (e.g., corresponding to PBC 36) and "device code" (e.g., corresponding to loads 10,12 of RCBs 28,30, respectively, or to a load, such as 8, controlled by an X10 slave, such as 60). For example, at 608, if the X10 address matches the "house code" of PBC 36 as determined by the address switch settings of DIP switches 154 of the PBC 36, and the "device code" is valid (e.g., it matches the device code of slave 60), then an X10 open (or close) load message is sent to the requested load at 610.

Figure 15:
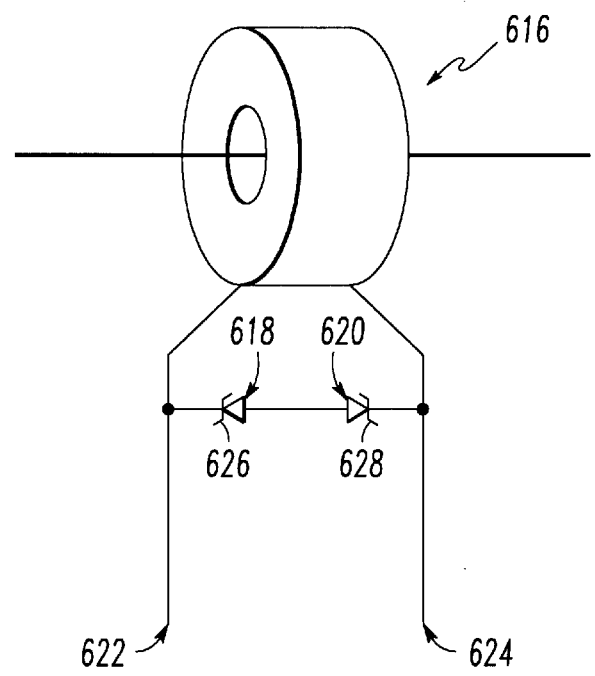
FIG. 15 is a block diagram of an improved current sensor in accordance with the invention.

Referring to FIGS. 4 and 15, the current transformer CT 616 of FIG. 15 is similar to the CT 176 of FIG. 4. The CT 176 of FIG. 4 may be damaged if primary current in the CT exists without having the CTs secondary 177 (shown in FIG. 4) connected to the input 190 of multiplier 178. This is because an open circuited secondary winding of an energized CT may develop a very high voltage which, if not limited, might damage the insulation on the wire of the secondary winding. As shown in FIG. 15, a pair of back-to-back zener diodes 618 and 620 (e.g., about 10 VDC) provides suitable protection. The CT 616 produces a current value across outputs 622,624. The zener diode 618 has a cathode 626 connected to the output 622. The zener diode 620 is in series with the zener diode 618 and has a cathode 628 connected to the other output 624. The zeners 618,620 are mounted on the CT 616 such that they are connected to the CT secondary 177, even if the CT 616 is not connected to the multiplier 178.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A panelboard apparatus for at least one power line and a plurality of loads, said panelboard apparatus comprising:
    a housing;
    a plurality of electrical switching means housed by said housing, with each of said electrical switching means for switching a circuit from at least one of said at least one power line to at least one of said loads, and with each of at least some of said electrical switching means including remotely controllable actuating means for actuating said each of at least some of said electrical switching means and switching a circuit from at least one of said at least one power line to at least one of said loads; and
    control and monitoring means substantially housed by said housing comprising:
        control means for controlling said remotely controllable actuating means of said at least some of said electrical switching means, and
        monitoring means at least for monitoring power or energy consumed in the circuits of said at least some of said electrical switching means.

2. The panelboard apparatus as recited in claim 1 wherein said at least one power line includes a plurality of voltage lines and a neutral line, with a voltage between each of the voltage lines and the neutral line; and wherein said monitoring means includes half wave rectification monitoring means for determining, for each of the voltage lines, an average of the voltage between one of the voltage lines and the neutral line.

3. The panelboard apparatus as recited in claim 1 wherein said at least one power line includes a first voltage line, a second voltage line, and a third neutral line which source a first line-neutral voltage to at least one of the loads and a second line-neutral voltage to another of the loads; wherein a first circuit from the first voltage line to said at least one of the loads has a first load current; wherein a second circuit from the second voltage line to said another of the loads has a second load current; and wherein said monitoring means comprises:
    first and second current sensor means for sensing the first and second load currents in the first and second circuits, respectively, with each of said current sensor means having an output with a current signal;
    power signal producing means interconnected with the first voltage line, the second voltage line and the third neutral line, said power signal producing means having inputs interconnected with the outputs of said first and second current sensor means to produce a first power signal at a first output and a second power signal at a second output, respectively; and
    means connected to the first and second outputs of said power signal producing means for converting the first and second power signals to first and second power values and for processing said first and second power values.

4. The panelboard apparatus as recited in claim 1 wherein said at least one power line includes a first voltage line, a second voltage line, and a third neutral line which source a first line-neutral voltage to one of the loads and a second line-neutral voltage to another one of the loads;
wherein a circuit from the first voltage line to said one of the loads and back to the second voltage line has a load current;
wherein said monitoring means comprises:
    current sensor means for sensing the load current, with said current sensor means having an output with a current signal;
    pulse width modulator means interconnected with the first voltage line, the second voltage line and the third neutral line including:
        an output having a pulse width modulated signal, means for producing first and second intermediate pulse width modulated signals from the first line-neutral voltage between the first voltage line and the third neutral line and the second line-neutral voltage between the second voltage line and the third neutral line, respectively, and
        means having a control input for selecting one of the first and second intermediate pulse width modulated signals for said output of said pulse width modulator means;

multiplier means having an input interconnected with the output of said pulse width modulator means for multiplying the current signal of said current sensor means and the pulse width modulated signal of the output of said pulse width modulator means to produce a power signal at an output;

analog-to-digital conversion means connected to the output of said multiplier means for converting the power signal to a power value; and processing means for processing the power value, with said processing means having a control output interconnected with the control input of said pulse width modulator means for selecting one of said first and second intermediate pulse width modulated signals.

5. The panelboard apparatus as recited in claim 1 wherein said at least one power line includes a first voltage line, a second voltage line, and a third neutral line which source a first line-neutral voltage to one of the loads and a second line-neutral voltage to another one of the loads;

wherein a circuit from one of the first and second voltage lines to said one of the loads has a load current;

wherein said monitoring means comprises:

current sensor means for sensing the load current, with said current sensor means having an output with a current signal;

pulse width modulator means interconnected with the first voltage line, the second voltage line and the third neutral line including:

an output having a pulse width modulated signal, means for producing first and second intermediate pulse width modulated signals from the first line-neutral voltage between the first voltage line and the third neutral line, and from the second line-neutral voltage between the second voltage line and the third neutral line, respectively, and means having a control input for selecting one of the first and second intermediate pulse width modulated signals for said output of said pulse width modulator means;

multiplier means having an input interconnected with the output of said pulse width modulator means for multiplying the current signal of said current sensor means and the pulse width modulated signal of the output of said pulse width modulator means to produce a power signal at an output;

analog-to-digital conversion means connected to the output of said multiplier means for converting the power signal to a power value; and processing means for processing the power value, with said processing means having a control output interconnected with the control input of said pulse width modulator means for selecting one of said first and second intermediate pulse width modulated signals.

6. The panelboard apparatus as recited in claim 1 wherein said at least one power line includes a first voltage line, a second voltage line, and a third neutral line which source a first line-line voltage to one of the loads and a second line-neutral voltage to another one of the loads;

wherein a circuit from the first voltage line to said one of the loads and back to the second voltage line has a load current;

wherein said monitoring means comprises:

current sensor means for sensing the load current, with said current sensor means having an output with a current signal;

pulse width modulator means interconnected with the first voltage line, the second voltage line and the third neutral line including:

an output having a pulse width modulated signal, means for producing first and second intermediate pulse width modulated signals from the first line-neutral voltage between the first voltage line and the third neutral line, and from the second line-neutral voltage between the second voltage line and the third neutral line, respectively, selection means having a control input for selecting one of the first and second intermediate pulse width modulated signals and producing an intermediate signal;

selective inversion means having a control input for selectively inverting the intermediate signal to produce the pulse width modulated signal at the output of said pulse width modulator means;

multiplier means having an input interconnected with the output of said pulse width modulator means for multiplying the current signal of said current sensor means and the pulse width modulated signal of the output of said pulse width modulator means to produce a power signal at an output;

analog-to-digital conversion means connected to the output of said multiplier means for converting the power signal to a power value; and processing means for processing the power value, with said processing means having a first control output interconnected with the control input of said selection means for selecting the intermediate signal from one of said first and second intermediate pulse width modulated signals, and also having a second control output interconnected with the control input of said selective inversion means for selectively inverting the intermediate signal to produce the pulse width modulated signal at the output of said pulse width modulator means.

7. The panelboard apparatus as recited in claim 1 wherein said at least one power line includes a first voltage line, a second voltage line, a third voltage line, and a fourth neutral line which source a first line-neutral voltage to one of the loads, a second line-neutral voltage to another one of the loads, a third line-neutral voltage to still another one of the loads, and a line-line voltage to a further one of the loads;

wherein a circuit from one of the first, second and third voltage lines to said further one of the loads and back to another one of the first, second and third voltage lines has a load current;

wherein said monitoring means comprises:

current sensor means for sensing the load current, with said current sensor means having an output with a current signal;

pulse width modulator means interconnected with the first voltage line, the second voltage line, the third voltage line and the fourth neutral line including:

an output having a pulse width modulated signal, means for producing first, second and third intermediate pulse width modulated signals from the first line-neutral voltage between the first voltage line and the fourth neutral line, the second line-neutral voltage between the second voltage line and the fourth neutral line, and the third line-neutral voltage between the third voltage line and the fourth neutral line, respectively, selection means having a control input for selecting one of the first, second and third intermediate pulse width modulated signals and producing an intermediate signal;

selective inversion means having a control input for selectively inverting the intermediate signal to produce the pulse width modulated signal at the output of said pulse width modulator means;

multiplier means having an input interconnected with the output of said pulse width modulator means for multiplying the current signal of said current sensor means and the pulse width modulated signal of the output of said pulse width modulator means to produce a power signal at an output;

analog-to-digital conversion means connected to the output of said multiplier means for converting the power signal to a power value; and processing means for processing the power value, with said processing means having a first control output interconnected with the control input of said selection means for selecting the intermediate signal from one of said first, second and third intermediate pulse width modulated signals, and also having a second control output interconnected with the control input of said selective inversion means for selectively inverting the intermediate signal to produce the pulse width modulated signal at the output of said pulse width modulator means.

8. The panelboard apparatus as recited in claim 1 wherein one of the loads has a load current; and wherein said monitoring means includes:

current sensor means for sensing the load current and producing a current value across a pair of outputs;

first zener diode means having a cathode connected to one of the outputs; and second zener diode means in series with said first zener diode means having a cathode connected to the other of the outputs.

9. The panelboard apparatus as recited in claim 1 wherein said each of at least some of said electrical switching means includes separable contact means; wherein said remotely controllable actuating means includes operating means having a control input for switching said separable contact means; and wherein said control means includes output means having a control output interconnected with the control input of said operating means for outputting a control signal having a plurality of states to said control input, and further includes indicator means interconnected with the control output of said output means for indicating at least one of the states of the control signal.

10. The panelboard apparatus as recited in claim 9 wherein said operating means includes a coil; wherein the control signal of said output means has a first state for energizing the coil and a second state for de-energizing the coil; and wherein said indicator means includes means for indicating the second state of the control signal which de-energizes the coil.

11. The panelboard apparatus as recited in claim 1 wherein said at least one power line includes a first voltage line, a second voltage line, and a third neutral line which source a first line-neutral voltage to at least one of the loads and a second line-neutral voltage to another of the loads; wherein a first circuit from the first voltage line to said at least one of the loads has a first load current; wherein a second circuit from the second voltage line to said another of the loads has a second load current; and wherein said monitoring means comprises:

first and second current sensor means for sensing the first and second load currents in the first and second circuits, respectively, with each of said current sensor means having an output with a current signal;

pulse width modulator means interconnected with the first voltage line, the second voltage line and the third neutral line, said pulse width modulator means having first and second outputs for producing first and second pulse width modulated signals from the first line-neutral voltage and the second line-neutral voltage, respectively;

first and second multiplier means each of which has a first input interconnected with the output of one of said first and second current sensor means and a second input interconnected with one of the first and second outputs of said pulse width modulator means, each of said first and second multiplier means for multiplying one of the current signals of said first and second current sensor means and one of the first and second pulse width modulated signals to produce a first power signal at a first output and a second power signal at a second output, respectively;

analog-to-digital conversion means connected to the first and second outputs of the first and second multiplier means, respectively, for converting the first and second power signals to first and second power values, respectively; and processing means for processing the first and second power values.

12. The panelboard apparatus as recited in claim 11 wherein said first voltage line and said third neutral line source the first line-neutral voltage to a plurality of first loads, with a plurality of first circuits from the first voltage line to the first loads and with each of the first circuits having one of a plurality of first load currents; wherein said first current sensor means includes a plurality of current sensors each of which has an output for one of the first circuits; wherein said multiplier means includes a plurality of multipliers each of which has an input connected to the output of one of said plurality of current sensors and an output having one of the power signals; wherein said analog-to-digital conversion means includes a plurality of inputs each of which is connected to the output of one of the multipliers and means for converting said plurality of power signals to a plurality of power values; and wherein said processing means includes means for processing said plurality of power values.

13. The panelboard apparatus as recited in claim 1 wherein said monitoring means includes input means having a status input for a status signal and indicator means interconnected with said status input for indicating at least one of the states of the status signal; and wherein said each of at least some of said electrical switching means includes a line terminal, a load terminal, separable contact means between the line terminal and the load terminal, and electrical interconnection means for interconnecting the load terminal of said each of at least some of said electrical switching means with the status input of said input means and outputting the status signal having a plurality of states to said status input.

14. The panelboard apparatus as recited in claim 13 wherein the status signal of said electrical interconnection means has a first state when said separable contact means is closed and a second state when said separable contact means is open; and wherein said indicator means includes means for indicating the first state of the status signal when said separable contact means is closed.

15. The panelboard apparatus as recited in claim 13 wherein said electrical interconnection means includes a resistor electrically interconnected between the status input of said input means and the load terminal.

16. The panelboard apparatus as recited in claim 13 wherein said each of at least some of said electrical switching means further includes circuit breaker means and contactor means; and wherein said separable contact means includes a first pair of separable contacts in series with a second pair of separable contacts, with the circuit breaker means controlling said first pair of separable contacts and with the contactor means controlling the second pair of separable contacts.

17. The panelboard apparatus as recited in claim 1 wherein said each of at least some of said electrical switching means includes a remote controlled circuit breaker; wherein said control and monitoring means includes a panelboard controller means substantially within said housing and master control means, with said panelboard controller means and said master control means both having power line communication means for communicating a message therebetween over said at least one power line; wherein said remote controlled circuit breaker includes separable contact means and operating means having a control input for switching said separable contact means; and wherein said panelboard controller means includes output means having a control output with a control signal interconnected with the control input of said operating means, with said panelboard controller means receiving the message from the power line communication means thereof and outputting the control signal in response to the message through the control output of the output means to the control input of the operating means of the remote controlled circuit breaker.

18. The panelboard apparatus as recited in Claim 17 wherein the message includes a first field for selecting said panelboard controller means, and a second field having a plurality of states for selecting one of the remote controlled circuit breakers; and wherein said output means includes a plurality of control outputs for interconnection with the control inputs of the remote controlled circuit breakers, with said output means of said panelboard controller means employing one of the control outputs in response to the state of the second field.

19. The panelboard apparatus as recited in claim 18 wherein said master control means is an X10 master interconnected with one of said loads; wherein the first field is an X10 house code for selecting said panelboard controller means; and wherein the second field is an X10 device code for selecting said one of the remote controlled circuit breakers.

20. The panelboard apparatus as recited in claim 18 wherein said master control means is a CEBus master interconnected with said at least one power line; wherein the first field is an X10 house code for selecting said panelboard controller means; and wherein the second field is an X10 device code for selecting said one of the remote controlled circuit breakers.

21. The panelboard apparatus as recited in claim 1 wherein said at least one power line includes a first voltage line and a second neutral line which source a line-neutral voltage to one of the loads; wherein the circuit from the first voltage line to said one of the loads has a load current; and wherein said monitoring means comprises:
  current sensor means for sensing the load current in said circuit from the first voltage line to said one of the loads, said current sensor means having an output with a current signal;
  pulse width modulator means interconnected with the first voltage line and the second neutral line, said pulse width modulator means having an output for producing a pulse width modulated signal from the line-neutral voltage;
  multiplier means having a first input interconnected with the output of said current sensor means and a second input interconnected with the output of said pulse width modulator means for multiplying the current signal and the pulse width modulated signal to produce a power signal at an output;
  analog-to-digital conversion means connected to the output of the multiplier means for converting the power signal to a power value; and
  processing means for processing the power value.

22. The panelboard apparatus as recited in claim 21 wherein the pulse width modulated signal has an on state and an off state;
wherein the current signal has a magnitude and a sign;
wherein said pulse width modulator means includes:
  means generating a signal having a triangular waveform,
  means comparing the signal having the triangular waveform with the line-neutral voltage, and
  means producing the on state of the pulse width modulated signal when the line-neutral voltage about exceeds the signal having the triangular waveform, and producing the off state of the pulse width modulated signal otherwise; and
wherein said multiplier means includes:
  means producing an intermediate signal having a magnitude corresponding to the magnitude of the current signal, having a sign equal to the sign of the current signal for the on state of the pulse width modulated signal, and having a sign opposite from the sign of the current signal for the off state of the pulse width modulated signal, and
  means averaging the intermediate signal to produce the power signal at the output of said multiplier means.

23. The panelboard apparatus as recited in claim 21 wherein said pulse width modulator means includes means producing an intermediate pulse width modulated signal from the line-neutral voltage, and means having a control input for selectively inverting the intermediate pulse width modulated signal to produce the pulse width modulated signal at the output of said pulse width modulator means; and wherein said processing means has a control output interconnected with the control input of said means having a control input for selectively inverting the pulse width modulated signal.

24. A panelboard apparatus for at least one power line and a plurality of loads, said panelboard apparatus comprising:
  a housing;
  a plurality of electrical switching means housed by said housing, with each of said electrical switching means for switching a circuit from at least one of said at least one power line to at least one of said loads, and with each of at least some of said electrical switching means including remotely controllable actuating means for actuating said each of at least some of said electrical switching means and switching a circuit from at least one of said at least one power line to at least one of said loads;

control and monitoring means housed by said housing comprising:

control means for controlling said remotely controllable actuating means of said at least some of said electrical switching means, and monitoring means at least for monitoring power or energy consumed in the circuits of said at least some of said electrical switching means; and management means cooperating with said control and monitoring means for switching the circuit from one of said at least one power line to said at least one of said loads.

25. The panelboard apparatus as recited in claim 24 wherein said management means and said control and monitoring means both include X10 communication means therebetween.

26. The panelboard apparatus as recited in claim 24 wherein said management means and said control and monitoring means both include CEBus communication means therebetween.

27. The panelboard apparatus as recited in claim 24 wherein said management means and said control and monitoring means both include X10 communication means and CEBus communication means therebetween.

\* \* \* \* \*